US011646713B2

(12) United States Patent
Suzuki et al.

(10) Patent No.: US 11,646,713 B2
(45) Date of Patent: May 9, 2023

(54) ACOUSTIC WAVE DEVICE

(71) Applicant: Murata Manufacturing Co., Ltd., Nagaokakyo (JP)

(72) Inventors: Takanao Suzuki, Nagaokakyo (JP); Koji Miyamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 233 days.

(21) Appl. No.: 16/896,264

(22) Filed: Jun. 9, 2020

(65) Prior Publication Data

US 2020/0304097 A1    Sep. 24, 2020

Related U.S. Application Data

(63) Continuation of application No. PCT/JP2018/039062, filed on Oct. 19, 2018.

(30) Foreign Application Priority Data

Dec. 19, 2017   (JP) .............................. JP2017-242527

(51) Int. Cl.
*H03H 9/02*   (2006.01)
*H03H 9/145*  (2006.01)
*H03H 9/25*   (2006.01)
*H03H 9/64*   (2006.01)

(52) U.S. Cl.
CPC ........ *H03H 9/02992* (2013.01); *H03H 9/145* (2013.01); *H03H 9/25* (2013.01); *H03H 9/64* (2013.01)

(58) Field of Classification Search
CPC ...... H03H 9/02992; H03H 9/145; H03H 9/25; H03H 9/64
See application file for complete search history.

(56) References Cited

U.S. PATENT DOCUMENTS

2011/0068655 A1   3/2011   Solal et al.
2012/0306594 A1   12/2012  Tanaka
2013/0051588 A1*  2/2013   Ruile ................. H03H 9/02858
                                                    29/25.35

(Continued)

FOREIGN PATENT DOCUMENTS

JP   2012-186808 A   9/2012
WO   2011/099532 A1  8/2011

(Continued)

OTHER PUBLICATIONS

Official Communication issued in International Patent Application No. PCT/JP2018/039062, dated Jan. 8, 2019.

*Primary Examiner* — Samuel S Outten
(74) *Attorney, Agent, or Firm* — Keating & Bennett, LLP

(57) ABSTRACT

An acoustic wave device includes a plurality of interdigital transducer electrodes, in a first interdigital transducer electrode, a first electrode finger includes a wide portion having a greater width in the second direction than a center portion. In the first interdigital transducer electrode, for the first electrode finger, a first distance that is a maximum distance in the second direction between a center line of the center portion in a first direction is shorter than a second distance that is a maximum distance in a second direction between the center line of the center portion and an outer edge, away from a second interdigital transducer electrode, of the wide portion.

17 Claims, 16 Drawing Sheets

(56) References Cited

U.S. PATENT DOCUMENTS

| | | |
|---|---|---|
| 2016/0072475 A1 | 3/2016 | Mimura et al. |
| 2017/0047905 A1 | 2/2017 | Araki et al. |
| 2018/0054179 A1* | 2/2018 | Gamble ............ H03H 9/02015 |
| 2019/0109579 A1 | 4/2019 | Tanaka |

FOREIGN PATENT DOCUMENTS

| | | |
|---|---|---|
| WO | 2014/192756 A1 | 12/2014 |
| WO | 2015/182522 A1 | 12/2015 |
| WO | 2017/051874 A1 | 3/2017 |

* cited by examiner

ACOUSTIC WAVE DEVICE

CROSS REFERENCE TO RELATED APPLICATIONS

This application claims the benefit of priority to Japanese Patent Application No. 2017-242527 filed on Dec. 19, 2017 and is a Continuation Application of PCT Application No. PCT/JP2018/039062 filed on Oct. 19, 2018. The entire contents of each application are hereby incorporated herein by reference.

BACKGROUND OF THE INVENTION

1. Field of the Invention

The present invention generally relates to an acoustic wave device and, more specifically, to an acoustic wave device including an interdigital transducer electrode.

2. Description of the Related Art

Hitherto, as an acoustic wave device, there is known an acoustic wave device that includes a piezoelectric substrate (piezoelectric body portion) and an interdigital transducer electrode provided on or above the piezoelectric substrate and in which wide portions are provided in a portion of electrode fingers of the interdigital transducer electrode (see, for example, International Publication No. 2014/192756). In an example of the acoustic wave device described in International Publication No. 2014/192756, a reflector is formed on each side of the interdigital transducer electrode in a propagation direction of surface acoustic waves on the piezoelectric substrate. The interdigital transducer electrode and the reflectors are made of a metal material. The acoustic wave device described in International Publication No. 2014/192756 has such characteristics that the acoustic wave device has a structure of suppressing a transverse-mode ripple by forming a piston mode in the interdigital transducer electrode.

In the acoustic wave device described in International Publication No. 2014/192756, the interdigital transducer electrode includes a first busbar, a second busbar disposed apart from the first busbar, a plurality of first electrode fingers of which proximal ends are electrically connected to the first busbar and distal ends are extended toward the second busbar, and a plurality of second electrode fingers of which proximal ends are connected to the second busbar and distal ends are extended toward the first busbar. In the above-described acoustic wave device, wide portions are provided in both of the first electrode fingers and the second electrode fingers.

The first busbar includes a plurality of opening portions separately disposed along a length direction of the first busbar. The first busbar includes an inner busbar portion located closer to the first electrode fingers than the plurality of opening portions and extending in the length direction of the first busbar, a center busbar portion in which the plurality of opening portions is provided, and an outer busbar portion located across the center busbar portion from the inner busbar portion.

The second busbar includes a plurality of opening portions separately disposed along a length direction of the second busbar. The second busbar includes an inner busbar portion located closer to the second electrode fingers than the plurality of opening portions and extending in the length direction of the second busbar, a center busbar portion in which the plurality of opening portions is provided, and an outer busbar portion located across the center busbar portion from the inner busbar portion.

International Publication No. 2014/192756 describes that the invention described in International Publication No. 2014/192756 is applicable to not only the electrode shape of a one-port resonator but also various acoustic wave devices, such as bandpass filters.

The inventors of the present invention discovered that in an acoustic wave device in which the wide portions are provided in a portion of the electrode fingers of the interdigital transducer electrode, for example, the electrode fingers having different in potentials in interdigital transducer electrodes of adjacent resonators are adjacent to each other in the length directions of the first busbar and second busbar, so a surge breakdown sometimes occurs between the adjacent electrode fingers because of electrostatic discharge (ESD).

SUMMARY OF THE INVENTION

Preferred embodiments of the present invention provide acoustic wave devices that are each able to improve ESD tolerance while reducing or preventing interference with a piston mode.

An acoustic wave device according to a preferred embodiment of the present invention includes a first terminal, a second terminal, a piezoelectric body portion, and a plurality of interdigital transducer electrodes. The second terminal has a lower potential than the first terminal. The plurality of interdigital transducer electrodes are provided on or above the piezoelectric body portion and electrically connected to the first terminal and the second terminal. Each of the plurality of interdigital transducer electrodes includes a first busbar, a second busbar, a plurality of first electrode fingers, and a plurality of second electrode fingers. The second busbar is opposed to the first busbar in a first direction. The plurality of first electrode fingers are connected to the first busbar and extend from the first busbar toward the second busbar in the first direction. The plurality of second electrode fingers are connected to the second busbar and extend from the second busbar toward the first busbar in the first direction. The plurality of first electrode fingers and the plurality of second electrode fingers are spaced apart from each other in a second direction perpendicular to the first direction. Each of the first busbar and the second busbar includes an opening portion, an inner busbar portion, an outer busbar portion, and a coupling portion. The inner busbar portion is located closer to a group of electrode fingers including the plurality of first electrode fingers and the plurality of second electrode fingers than the opening portion in the first direction. The outer busbar portion is located across the opening portion from the inner busbar portion in the first direction. The coupling portion couples the inner busbar portion and the outer busbar portion in the first direction. Where, of the plurality of interdigital transducer electrodes, one of the two interdigital transducer electrodes adjacent to each other in the second direction is a first interdigital transducer electrode and another one of the interdigital transducer electrodes is a second interdigital transducer electrode, one of the electrode fingers closest to the second interdigital transducer electrode of the group of electrode fingers of the first interdigital transducer electrode and the electrode finger closest to the first interdigital transducer electrode of the group of electrode fingers of the second interdigital transducer electrode is connected to the first terminal, and another is connected to the second terminal. In the first interdigital transducer electrode, the electrode finger closest to the second interdigital transducer electrode of the group of electrode fingers of the first interdigital transducer electrode includes a wide portion have a greater with in the second direction than a center portion, in the first direction, of the electrode finger closest to the second interdigital transducer electrode. In the first interdigital transducer electrode, for the electrode finger closest to the second interdigital transducer electrode, a first distance that is a maximum distance in the second direction between a center line of the center portion along the first direction and an outer edge, closer to the second interdigital transducer electrode, of the wide portion is shorter than a second distance that is a maximum distance in the second direction between the center line of the center portion and an outer edge, away from the second interdigital transducer electrode, of the wide portion.

An acoustic wave device according to a preferred embodiment of the present invention includes a first terminal, a second terminal, a piezoelectric body portion, and a plurality of interdigital transducer electrodes. The second terminal has a lower potential than the first terminal. The plurality of interdigital transducer electrodes are provided on or above the piezoelectric body portion and electrically connected to the first terminal and the second terminal. Each of the plurality of interdigital transducer electrodes includes a first busbar, a second busbar, a plurality of first electrode fingers, and a plurality of second electrode fingers. The second busbar is opposed to the first busbar in a first direction. The plurality of first electrode fingers are connected to the first busbar and extend from the first busbar toward the second busbar in the first direction. The plurality of second electrode fingers are connected to the second busbar and extend from the second busbar toward the first busbar in the first direction. The plurality of first electrode fingers and the plurality of second electrode fingers are spaced apart from each other in a second direction perpendicular to the first direction. Each of the first busbar and the second busbar includes an opening portion, an inner busbar portion, an outer busbar portion, and a coupling portion. The inner busbar portion is located closer to a group of electrode fingers including the plurality of first electrode fingers and the plurality of second electrode fingers than the opening portion in the first direction. The outer busbar portion is located across the opening portion from the inner busbar portion in the first direction. The coupling portion couples the inner busbar portion and the outer busbar portion in the first direction. At least one electrode finger of the plurality of first electrode fingers includes a wide portion having a greater width in the second direction than a center portion, in the first direction, of the at least one electrode finger, and at least one electrode finger of the plurality of second electrode fingers includes a wide portion having a greater width in the second direction than a center portion, in the first direction, of the at least one electrode finger. Where, of the plurality of interdigital transducer electrodes, one of the two interdigital transducer electrodes adjacent to each other in the second direction is a first interdigital transducer electrode and another one of the interdigital transducer electrodes is a second interdigital transducer electrode, one of the electrode finger closest to the second interdigital transducer electrode of the group of electrode fingers of the first interdigital transducer electrode and the electrode finger closest to the first interdigital transducer electrode of the group of electrode fingers of the second interdigital transducer electrode is connected to the first terminal, and another is connected to the second terminal. In the first interdigital transducer electrode, the electrode finger closest to the second interdigital transducer electrode does not have the wide portion, and at least one of the electrode fingers other than the electrode finger closest to the second interdigital transducer electrode has the wide portion.

Acoustic wave devices according to preferred embodiments of the present invention are each able to improve ESD tolerance while reducing or preventing interference with a piston mode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
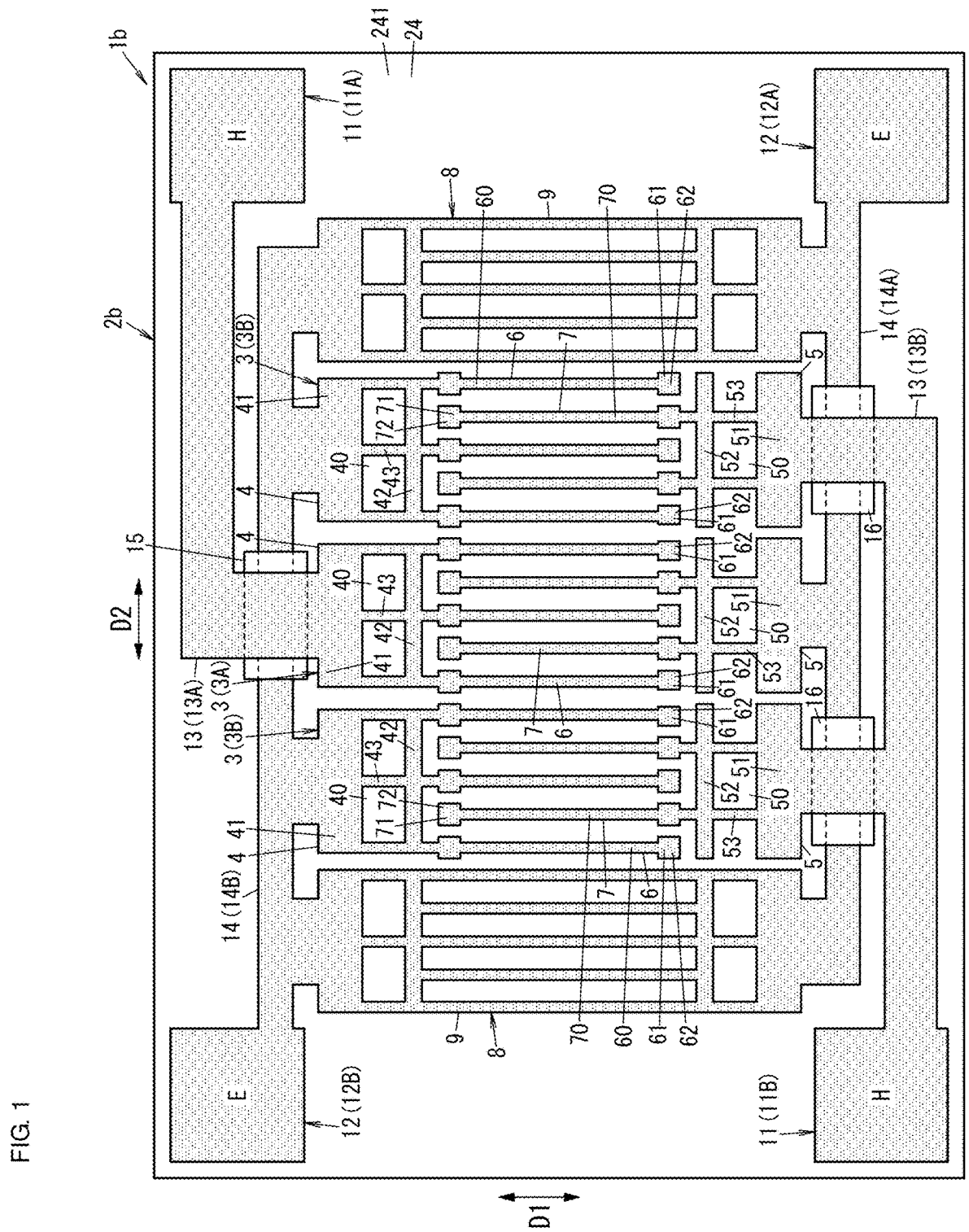
FIG. 1 is a plan view of an acoustic wave device according to a first preferred embodiment of the present invention.

Hereinafter, acoustic wave devices according to preferred embodiments of the present invention will be described with reference to the drawings.

FIG. 1 to FIG. 16 that will be used in the following preferred embodiments, and the like, all are schematic diagrams, and the ratios of the sizes and thicknesses of components in the drawings do not always reflect actual scale ratios.

First Preferred Embodiment (1.1) Overall Configuration of Acoustic Wave Device

Hereinafter, an acoustic wave device 1 according to the first preferred embodiment of the present invention will be described with reference to the drawings.

As shown in FIG. 1 to FIG. 5, the acoustic wave device 1 according to the first preferred embodiment preferably includes first terminals (which are, for example, signal terminals) 11, second terminals (which are, for example, ground terminals) 12, a piezoelectric body portion 24, and a plurality of (for example, three) interdigital transducer (IDT) electrodes 3. Each second terminal 12 has a lower potential than each first terminal 11. Therefore, each first terminal 11 has higher potential than each second terminal 12. The first terminals 11 and the second terminals 12 are provided on or above the piezoelectric body portion 24. Here, the state "provided on or above the piezoelectric body portion 24" includes the case of being directly provided on the piezoelectric body portion 24 and the case of being indirectly provided on the piezoelectric body portion 24. The acoustic wave device 1 preferably includes the plurality of (for example, three) second terminals 12. However, the acoustic wave device 1 only needs to include at least one second terminal 12. The piezoelectric body portion 24 is made of a piezoelectric material. The interdigital transducer electrodes 3 are provided on or above the piezoelectric body portion 24. Here, the state "provided on or above the piezoelectric body portion 24" includes the case of being directly provided on the piezoelectric body portion 24 and the case of being indirectly provided on the piezoelectric body portion 24. The acoustic wave device 1 according to the first preferred embodiment is preferably a longitudinally coupled resonator filter. The acoustic wave device 1 further includes two reflectors 8.

Figure 2:
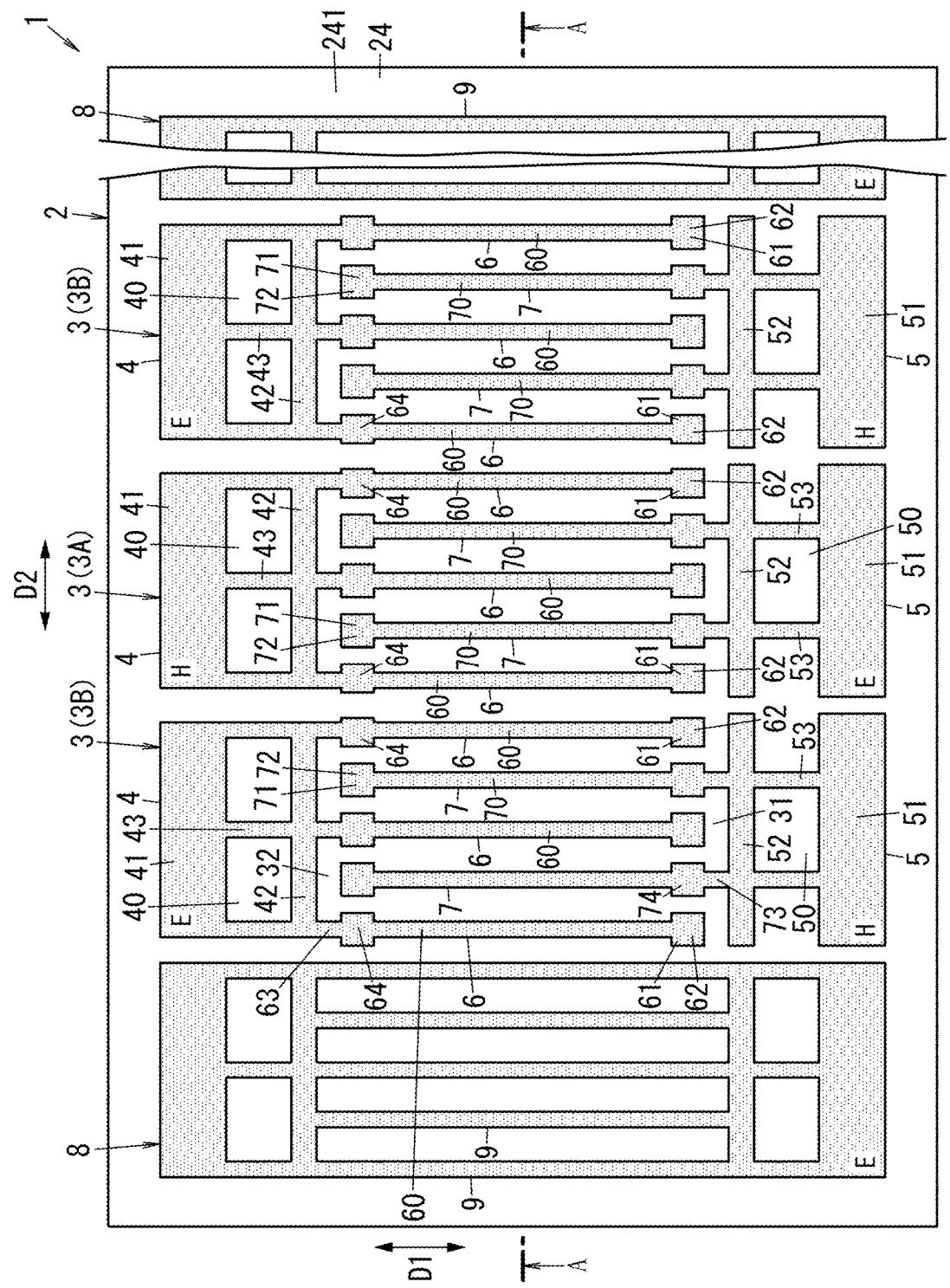
FIG. 2 is a plan view of a portion of the above acoustic wave device.

The acoustic wave device 1 according to the first preferred embodiment includes the first terminals (for example, signal terminals) 11 and the second terminals (for example, ground terminals) 12. Each second terminal 12 has a lower potential than each first terminal 11. The acoustic wave device 1 according to the first preferred embodiment further includes a first wiring layer 13 electrically connecting the interdigital transducer electrodes 3 and the first terminals 11 and a second wiring layer 14 electrically connecting the interdigital transducer electrodes 3 and the second terminals 12. In FIG. 1, for the sake of convenience of description, the label "H" is assigned to the first terminals 11 and portions (high potential portions) electrically connected to the first terminals 11 in the interdigital transducer electrodes 3, and the label "E" is assigned to the second terminals 12 and portions (low potential portions) electrically connected to the second terminals 12 in the interdigital transducer electrodes 3. The high potential portions are different in potential from the low potential portions. The high potential portions are portions higher in potential than the low potential portions. The labels "H", "E" are not actually present in the physical device. The acoustic wave device 1 includes the two first terminals 11 and the two second terminals 12. When the two first terminals 11 are distinguished from each other, one is referred to as first terminal 11A, and the other is referred to as first terminal 11B. When the two second terminals 12 are distinguished from each other, one is referred to as second terminal 12A, and the other is referred to as second terminal 12B. In FIG. 1 and FIG. 2, dot hatching is applied to the interdigital transducer electrodes 3 and the reflectors 8. These hatchings do not represent cross sections and are just used to clearly show the relationship among the interdigital transducer electrodes 3, the reflectors 8, and the piezoelectric body portion 24. In FIG. 1, dot hatching is applied to the first terminals 11, the second terminals 12, the first wiring layer 13, and the second wiring layer 14. These hatchings do not represent cross sections and are just used to more clearly show the relationship among the first terminals 11, the second terminals 12, the first wiring layer 13 and the second wiring layer 14, and the piezoelectric body portion 24.

In the acoustic wave device 1 according to the first preferred embodiment, the piezoelectric body portion 24 is a piezoelectric film, and the plurality of interdigital transducer electrodes 3 is provided on or above a multilayer board 2 including the piezoelectric body portion 24. The multilayer board 2 is a piezoelectric substrate at least partially having piezoelectricity.

(1.2) Components of Acoustic Wave Device

Next, the components of the acoustic wave device 1 will be described with reference to the drawings.

(1.2.1) Multilayer Board

Figure 3:
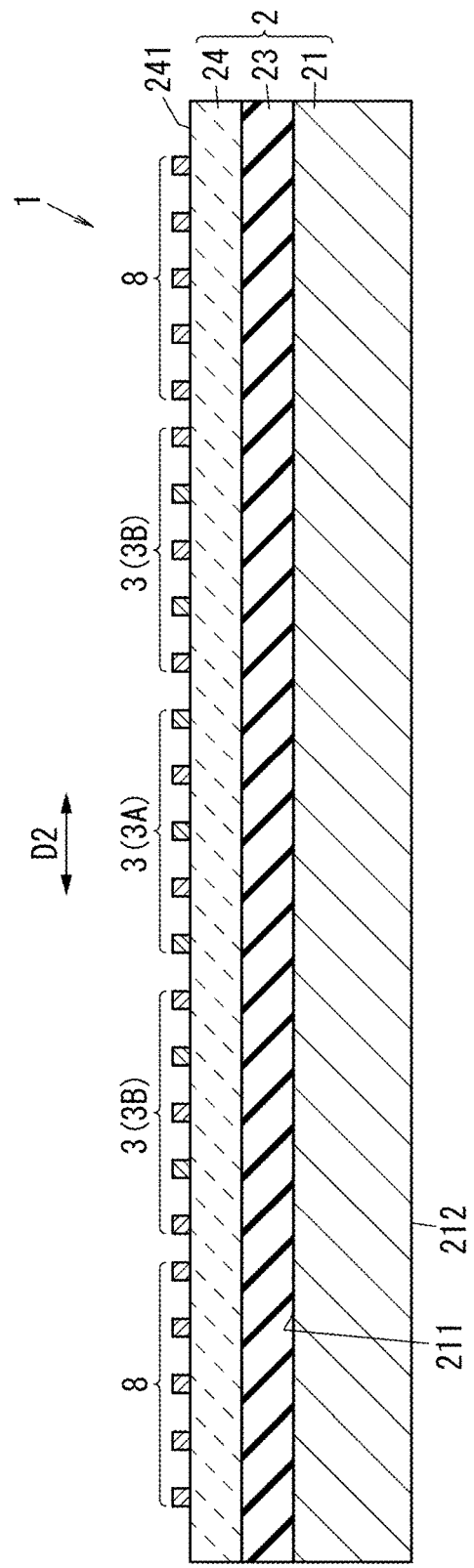
FIG. 3 relates to the above acoustic wave device and is a cross-sectional view taken along the line A-A in FIG. 2.

As shown in FIG. 3, the multilayer board 2 includes a high acoustic velocity support substrate 21, a low acoustic velocity film 23, and the piezoelectric body portion 24. In the high acoustic velocity support substrate 21, bulk waves propagate at a higher acoustic velocity than acoustic waves that propagate through the piezoelectric body portion 24. The low acoustic velocity film 23 is provided on or above the high acoustic velocity support substrate 21. Here, the state "provided on or above the high acoustic velocity support substrate 21" includes the case of being directly provided on the high acoustic velocity support substrate 21 and the case of being indirectly provided on the high acoustic velocity support substrate 21. In the low acoustic velocity film 23, bulk waves propagate at a lower acoustic velocity than acoustic waves that propagate through the piezoelectric body portion 24. The piezoelectric body portion 24 is provided on or above the low acoustic velocity film 23. Here, the state "provided on or above the low acoustic velocity film 23" includes the case of being directly provided on the low acoustic velocity film 23 and the case of being indirectly provided on the low acoustic velocity film 23. The piezoelectric body portion 24 is preferably indirectly provided on the high acoustic velocity support substrate 21. In this case, since the low acoustic velocity film 23 is provided between the high acoustic velocity support substrate 21 and the piezoelectric body portion 24 in the acoustic wave device 1, the acoustic velocity of acoustic waves decreases. The energy of acoustic waves substantially concentrates in a low acoustic velocity medium. Therefore, with the acoustic wave device 1, the effect of enclosing acoustic wave energy into the piezoelectric body portion 24 and the interdigital transducer electrode 3 in which acoustic waves are excited is improved. Therefore, with the acoustic wave device 1, a loss is reduced, and the quality factor is increased, in comparison with the case where no low acoustic velocity film 23 is provided.

The piezoelectric body portion 24 is preferably made of, for example, lithium tantalate (LiTaO$_3$), lithium niobate (LiNbO$_3$), zinc oxide (ZnO), aluminum nitride (AlN), or lead zirconate titanate (PZT).

The high acoustic velocity support substrate 21 supports a multilayer body including the low acoustic velocity film 23 and the piezoelectric body portion 24. Here, the high acoustic velocity support substrate 21 includes a first main surface 211 and a second main surface 212 that are on opposite sides in the thickness direction. The first main surface 211 and the second main surface 212 are provided back to back to each other. The plan-view shape of the high acoustic velocity support substrate 21 (the outer peripheral shape of the high acoustic velocity support substrate 21 when viewed in the thickness direction) is a rectangular or substantially rectangular shape, for example. However, the shape is not limited to a rectangular shape and may be, for example, a square or substantially square shape or any other desirable shape. The thickness of the high acoustic velocity support substrate 21 is preferably, for example, about 120 μm. The material of the high acoustic velocity support substrate 21 is preferably, for example, silicon. The high acoustic velocity support substrate 21 is not limited to silicon and may be made of any piezoelectric bodies, such as, for example, aluminum nitride, aluminum oxide, silicon carbide, silicon nitride, sapphire, lithium tantalate, lithium niobate, and quartz crystal, various ceramics, such as alumina, zirconia, cordierite, mullite, steatite, and forsterite, magnesia diamond, a material containing any one of the above materials as a main ingredient, and a material containing a mixture of some of the above materials as a main ingredient.

The low acoustic velocity film 23 is preferably made of any one of silicon oxide, glass, silicon oxynitride, tantalum oxide, a chemical compound obtained by adding fluorine, carbon, or boron to silicon oxide, and a material including any one of the above materials as a main ingredient.

When the low acoustic velocity film 23 is silicon oxide, temperature characteristics are improved. The elastic constant of lithium tantalate (LiTaO$_3$) has negative temperature characteristics, and the elastic constant of silicon oxide has positive temperature characteristics. Therefore, with the acoustic wave device 1, the absolute value of temperature coefficient of frequency (TCF) is reduced. In addition, the specific acoustic impedance of silicon oxide is less than the specific acoustic impedance of lithium tantalate (LiTaO$_3$). Therefore, with the acoustic wave device 1, both an increase in electromechanical coupling coefficient, that is, an expansion of fractional band width, and improvement in temperature coefficient of frequency are achieved.

In the acoustic wave device 1, the thickness of the piezoelectric body portion 24 is preferably, for example, less than or equal to about 3.5λ when the wavelength of acoustic waves, which is determined by the electrode finger pitch of the interdigital transducer electrode 3, is λ. This is because the quality factor increases. In the acoustic wave device 1, when the thickness of the piezoelectric body portion 24 is less than or equal to about 2.5λ, for example, the temperature coefficient of frequency improves. In addition, in the acoustic wave device 1, when the thickness of the piezoelectric body portion 24 is less than or equal to about 1.5λ, for example, adjustment of acoustic velocity becomes easy. The thickness of the piezoelectric body portion 24 is preferably, for example, about 600 nm.

The thickness of the low acoustic velocity film 23 is preferably, for example, less than or equal to about 2.0λ when the wavelength of acoustic waves, which is determined by the electrode finger pitch of the interdigital transducer electrode 3, is λ. In the acoustic wave device 1, when the thickness of the low acoustic velocity film 23 is less than or equal to about 2.0λ, for example, membrane stress is reduced. As a result, warpage of wafer that is the source of the high acoustic velocity support substrate 21 during manufacturing is reduced, so improvement of efficacy percentage and stabilization of characteristics are possible. The thickness of the low acoustic velocity film 23 is preferably, for example, about 600 nm.

(1.2.2) Reflector

The two reflectors 8 are provided on or above the piezoelectric body portion 24. More specifically, the two reflectors 8 are provided on or above one main surface 241 of the piezoelectric body portion 24. Here, the two reflectors 8 each are provided one by one across the interdigital transducer electrode 3 at any one of both sides of the three interdigital transducer electrodes 3 in the second direction D2 from the center interdigital transducer electrode 3. Hereinafter, for the sake of convenience of description, when the three interdigital transducer electrodes 3 are distinguished from one another, of the plurality of interdigital transducer electrodes 3, one of the adjacent two interdigital transducer electrodes 3 in the second direction D2 may be referred to as interdigital transducer electrode 3A and the other may be referred to as interdigital transducer electrode 3B. In the example of FIG. 1 and FIG. 2, of the three interdigital transducer electrodes 3, the center interdigital transducer electrode 3 is referred to as interdigital transducer electrode 3A, and the interdigital transducer electrodes 3 at two ends are referred to as interdigital transducer electrodes 3B.

Each of the two reflectors 8 reflects acoustic waves. Each of the two reflectors 8 is preferably a grating reflector, for example. Each of the two reflectors 8 includes a plurality of electrode fingers 9. One ends of the plurality of electrode fingers 9 in the first direction D1 are short-circuited, and the other ends are also short-circuited. In FIG. 1 and FIG. 2, each of the two reflectors 8 is drawn with the number of the electrode fingers 9 reduced to facilitate visualization.

(1.2.3) Interdigital Transducer Electrode

The interdigital transducer electrodes 3 each may preferably be made of an appropriate metal material, such as, for example, aluminum (Al), copper (Cu), platinum (Pt), gold (Au), silver (Ag), titanium (Ti), nickel (Ni), chromium (Cr), molybdenum (Mo), tungsten (W) and an alloy containing any one of these metals as a main ingredient. Alternatively, the interdigital transducer electrodes 3 may have such a structure that a plurality of metal films made of any one of these metals or alloys is laminated. The thickness of each interdigital transducer electrode 3 is preferably, for example, about 150 nm.

In the acoustic wave device 1 according to the first preferred embodiment, the three interdigital transducer electrodes 3 are arranged in the second direction D2. Each of the three interdigital transducer electrodes 3 preferably includes the first busbar 4, the second busbar 5, the plurality of first electrode fingers 6, and the plurality of second electrode fingers 7.

In the interdigital transducer electrode 3, the first busbar 4 and the second busbar 5 are opposed to each other in a first direction D1 perpendicular or substantially perpendicular to the thickness direction (up-down direction in FIG. 3) of the piezoelectric body portion 24. In other words, the second busbar 5 is opposed to the first busbar 4 in the first direction D1.

The first busbar 4 and the second busbar 5 each have a long shape having a second direction D2 perpendicular or substantially perpendicular to the first direction D1 as a longitudinal direction. In FIG. 1 and FIG. 2, the first busbar 4 and the second busbar 5 do not look like a long shape. This is because each of the number of the first electrode fingers 6 and the number of the second electrode fingers 7 is reduced to facilitate visualization. The second direction D2 is a direction along a propagation direction of acoustic waves. The second direction D2 is also perpendicular or substantially perpendicular to the thickness direction of the piezoelectric body portion 24.

The plurality of first electrode fingers 6 are connected to the first busbar 4 and extend from the first busbar 4 toward the second busbar 5 in the first direction D1. Here, the plurality of first electrode fingers 6 extend from the first busbar 4 along a direction perpendicular or substantially perpendicular to the longitudinal direction of the first busbar 4. In other words, the plurality of first electrode fingers 6 extend along a direction perpendicular or substantially perpendicular to the propagation direction of acoustic waves. In the interdigital transducer electrode 3, the plurality of first electrode fingers 6 are spaced apart from the second busbar 5, and a gap 31 is defined between the first electrode fingers 6 and the second busbar 5 that are opposed to each other in the first direction D1. When the wavelength of the above-described acoustic waves is $\lambda$, the length of the gap 31 in the first direction D1 is preferably, for example, less than or equal to about $0.5\lambda$.

The plurality of second electrode fingers 7 are connected to the second busbar 5 and extend from the second busbar 5 toward the first busbar 4 in the first direction D1. Here, the plurality of second electrode fingers 7 extend from the second busbar 5 along a direction perpendicular or substantially perpendicular to the longitudinal direction of the second busbar 5. In other words, the plurality of second electrode fingers 7 extend along a direction perpendicular or substantially perpendicular to the propagation direction of acoustic waves. In the interdigital transducer electrode 3, the plurality of second electrode fingers 7 are spaced apart from the first busbar 4, and a gap 32 is defined between the second electrode fingers 7 and the first busbar 4 that are opposed to each other in the first direction D1. When the wavelength of the above-described acoustic waves is $\lambda$, the length of the gap 32 in the first direction D1 is preferably, for example, less than or equal to about $0.5\lambda$.

In the interdigital transducer electrode 3, the plurality of first electrode fingers 6 and the plurality of second electrode fingers 7 are arranged alternately one by one so as to be spaced apart from each other in the second direction D2 perpendicular to the first direction D1. Therefore, the first electrode finger 6 and the second electrode finger 7 adjacent to each other in the second direction D2 are spaced apart from each other.

The first busbar 4 includes opening portions 40, an inner busbar portion 42, an outer busbar portion 41, and coupling portions 43. The inner busbar portion 42 is located closer to a group of electrode fingers including the plurality of first electrode fingers 6 and the plurality of second electrode fingers 7 than the opening portions 40 in the first direction D1. The outer busbar portion 41 is located across the opening portions 40 from the inner busbar portion 42 in the first direction D1. In other words, the outer busbar portion 41 is located away in the first direction D1 from a side where the plurality of first electrode fingers 6 is present. The coupling portions 43 couple the inner busbar portion 42 and the outer busbar portion 41 in the first direction D1. The coupling portions 43 are located on both sides of each opening portion 40 in the second direction D2. In the example of FIG. 1 and FIG. 2, each coupling portion 43 has the same width as the center portion 60, in the first direction D1, of the first electrode finger 6 and is located along an extension from the first electrode finger 6. However, the dimensions of each coupling portion 43 and the disposition of the coupling portions 43 are not limited thereto.

The opening shape of each opening portion 40 is rectangular or substantially rectangular, for example. However, the opening shape is not limited thereto. When the wavelength of the above-described acoustic waves is $\lambda$, the width of the inner busbar portion 42 in the first direction D1 is preferably, for example, less than or equal to about $0.5\lambda$. The length of each coupling portion 43 in the first direction D1 is preferably, for example, about $2.0\lambda$.

The plurality of opening portions 40 are preferably, for example, arranged at equal or substantially equal intervals in the second direction D2. In the example of FIG. 1 and FIG. 2, the opening width of each opening portion 40 in the second direction D2 is, for example, the same or substantially the same as the distance between the center portions 60 of the adjacent two first electrode fingers 6 in the second direction D2. The distance between the adjacent two opening portions 40 in the second direction D2 is, for example, the same or substantially the same as the width of the center portion 60 of the first electrode finger 6 in the second direction D2.

The second busbar 5 includes the opening portions 50, the inner busbar portion 52, the outer busbar portion 51, and the coupling portions 53. The inner busbar portion 52 is located closer to a group of electrode fingers including the plurality of first electrode fingers 6 and the plurality of second electrode fingers 7 than the opening portions 50 in the first direction D1. The outer busbar portion 51 is located across the opening portions 50 from the inner busbar portion 52 in the first direction D1. In other words, the outer busbar portion 51 is located away in the first direction D1 from a side where the plurality of second electrode fingers 7 is present. The coupling portions 53 couple the inner busbar portion 52 and the outer busbar portion 51 in the first direction D1. The coupling portions 53 are located on two sides of each opening portion 50 in the second direction D2. In the example of FIG. 1, each coupling portion 53 has the same or substantially the same width as the center portion 70, in the first direction D1, of the second electrode finger 7 and is located along an extension from the second electrode finger 7. However, the dimensions of each coupling portion 53 and the disposition of the coupling portions 53 are not limited thereto.

The opening shape of the opening portion 50 is rectangular or substantially rectangular, for example. However, the opening shape is not limited thereto. When the wavelength of the above-described acoustic waves is $\lambda$, the width of the inner busbar portion 52 in the first direction D1 is preferably, for example, less than or equal to about $0.5\lambda$. The length of each coupling portion 53 in the first direction D1 is preferably, for example, about $2.0\lambda$.

The second busbar 5 includes the plurality of opening portions 50. However, to facilitate visualization, the number of the second electrode fingers 7 is reduced in FIG. 1 and FIG. 2, so only one opening portion 50 is shown in FIG. 1 and FIG. 2. The plurality of opening portions 50 are, for example, arranged at equal or substantially equal intervals in the second direction D2. In the example of FIG. 1 and FIG. 2, the opening width of each opening portion 50 in the second direction D2 is preferably, for example, the same or substantially the same as the distance between the center portions 70 of the adjacent two second electrode fingers 7 in the second direction D2. Although only one opening portion 50 is shown in FIG. 1 and FIG. 2 as described above, the distance between the adjacent two opening portions 50 in the second direction D2 is, for example, the same or substantially the same as the width of the center portion 70 of the second electrode finger 7 in the second direction D2.

In the example of FIG. 1 and FIG. 2, the plurality of first electrode fingers 6 each have the same or substantially the same length. A distal end portion 61 of each of the plurality of first electrode fingers 6 includes a wide portion 62 having a greater width in the second direction D2 than a center portion 60, in the first direction D1, of the first electrode finger 6. Each of the plurality of first electrode fingers 6 preferably include a wide portion 64 (see FIG. 2) in addition to the wide portion 62. The wide portion 64 is between the center portion 60 and a proximal end portion 63 (see FIG. 2), opposite from the distal end portion 61, of the first electrode finger 6. The wide portion 64 is greater in width in the second direction D2 than the center portion 60, in the first direction D1, of the first electrode finger 6. The wide portion 64 is spaced apart from the first busbar 4 in the first direction D1. In each of the plurality of first electrode fingers 6, a portion between the wide portion 62 and the wide portion 64 in the first direction D1 is the center portion 60. In each of the plurality of first electrode fingers 6, the center portion 60 is longer in the first direction D1 than each of the wide portions 62, 64.

In the example of FIG. 1 and FIG. 2, the center portion 60 of each of the plurality of first electrode fingers 6 preferably has the same or substantially the same width. The width of the wide portion 62 at the distal end portion 61 and the width of the wide portion 64 closer to the proximal end portion 63 are the same or substantially the same in each of the plurality of first electrode fingers 6. Each of the wide portions 62, 64 has a rectangular or substantially rectangular shape, for example. However, the shape is not limited thereto and may be, for example, a hexagonal shape, a circular shape, or the like.

In the example of FIG. 1 and FIG. 2, the plurality of second electrode fingers 7 each preferably have the same or substantially the same length. A distal end portion 71 of each of the plurality of second electrode fingers 7 includes a wide portion 72 having a greater width in the second direction D2 than a center portion 70, in the first direction D1, of the second electrode finger 7. Each of the plurality of second electrode fingers 7 includes a wide portion 74 (see FIG. 2) in addition to the wide portion 72. The wide portion 74 is between the center portion 70 and a proximal end portion 73 (see FIG. 2), opposite from the distal end portion 71, of the second electrode finger 7. The wide portion 74 has a greater width in the second direction D2 than the center portion 70, in the first direction D1, of the second electrode finger 7. The wide portion 74 is spaced apart from the second busbar 5 in the first direction D1. In each of the plurality of second electrode fingers 7, a portion between the wide portion 72 and the wide portion 74 in the first direction D1 is the center portion 70. In each of the plurality of second electrode fingers 7, the center portion 70 is longer than each of the wide portions 72, 74 in the first direction D1.

In the example of FIG. 1 and FIG. 2, the center portion 70 of each of the plurality of second electrode fingers 7 preferably has the same or substantially the same width. The width of the wide portion 72 at the distal end portion 71 and the width of the wide portion 74 closer to the proximal end portion 73 are the same or substantially the same in each of the plurality of second electrode fingers 7. Each of the wide portions 72, 74 has a rectangular or substantially rectangular shape, for example. However, the shape is not limited thereto and may be, for example, a hexagonal shape, a circular shape, or the like.

In the interdigital transducer electrode 3, the wide portions 62 of the distal end portions 61 of the plurality of first electrode fingers 6 and the wide portions 74, closer to the proximal end portions 73, of the second electrode fingers 7 are arranged alternately one by one so as to be spaced apart from each other in the second direction D2. In addition, in the interdigital transducer electrode 3, the wide portions 64, closer to the proximal end portions 63, of the plurality of first electrode fingers 6 and the wide portions 72 of the distal end portions 71 of the second electrode fingers 7 are arranged alternately one by one so as to be spaced apart from each other in the second direction D2. The electrode finger pitch of the interdigital transducer electrode 3 is about twice the distance between sides respectively corresponding to the center portion 60 of the first electrode finger 6 and the center portion 70 of the second electrode finger 7, adjacent to each other. The electrode finger pitch of the interdigital transducer electrode 3 is the same value when defined by the distance between the center lines 6X (see FIG. 4) of the adjacent two first electrode fingers 6 in the second direction D2 of the plurality of first electrode fingers 6. In addition, the electrode finger pitch of the interdigital transducer electrode 3 is the same value when defined by the distance between the center lines 7X (see FIG. 4) of the adjacent two second electrode fingers 7 in the second direction D2 of the plurality of second electrode fingers 7.

The acoustic wave device 1 according to the first preferred embodiment has a structure of reducing or preventing a transverse-mode ripple by providing a piston mode in the interdigital transducer electrodes 3. This point will be described with reference to FIG. 5.

Figure 5:
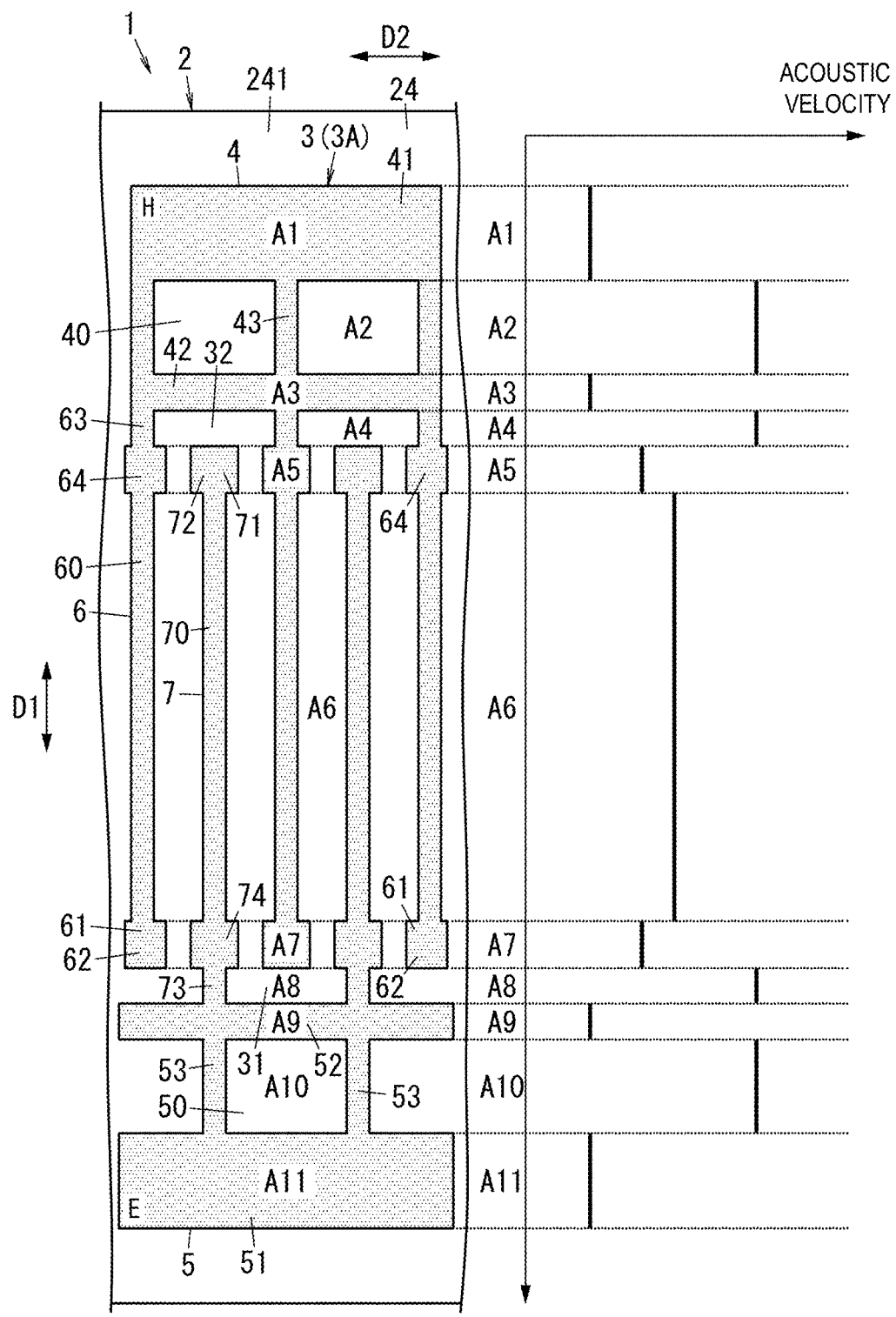
FIG. 5 is a schematic view illustrating a velocity distribution in a first direction of an acoustic velocity of acoustic waves that propagate in the above acoustic wave device in an acoustic wave propagation direction (second direction).

The acoustic wave device 1 includes resonators to the number of the interdigital transducer electrodes 3. Each of the three resonators includes the interdigital transducer electrode 3. The acoustic wave device 1 includes, for the resonator including a portion of the piezoelectric body portion 24 and the interdigital transducer electrode 3, 11 regions A1 to A11 in the first direction D1 in a plan view taken in the thickness direction of the multilayer body (that is, in a plan view taken in the thickness direction of the acoustic wave device 1) as shown at the left side of FIG. 5. The 11 regions A1 to A11 respectively include different portions in each of the piezoelectric body portion 24 and the interdigital transducer electrode 3. FIG. 5 schematically shows the velocity (acoustic velocity) of acoustic waves that propagate through the 11 regions A1 to A11 at the right side.

In the resonator of the acoustic wave device 1, of the above-described 11 regions A1 to A11, the region A6 located in the center in the first direction D1 is a center region. The center region includes the center portions 60 of the plurality of first electrode fingers 6 and the center portions 70 of the plurality of second electrode fingers 7. The center region is a region in which the center portions 60 of the plurality of first electrode fingers 6 and the center portions 70 of the plurality of second electrode fingers 7 overlap in the second direction D2. In the center region, a value (duty ratio) obtained by dividing the electrode finger width (the width of each of the center portion 60 of the first electrode finger 6 and the center portion 70 of the second electrode finger) by a value half the above-described electrode finger pitch is preferably, for example, about 0.5.

In the acoustic wave device 1, of the above-described 11 regions A1 to A11, the regions A1, A11 respectively located at two ends in the first direction D1 are outer busbar regions.

The region A1 includes the outer busbar portion 41 of the first busbar 4. The region A11 includes the outer busbar portion 51 of the second busbar 5. The acoustic velocity of acoustic waves in the outer busbar regions is lower than the acoustic velocity in the center region.

In the acoustic wave device 1, of the above-described 11 regions A1 to A11, the regions A2, A10 respectively located at the second from two ends in the first direction D1 are coupling regions. The region A2 includes the plurality of coupling portions 43 and plurality of opening portions 40 of the first busbar 4. The region A10 includes the plurality of coupling portions 53 and plurality of opening portions 50 of the second busbar 5. The acoustic velocity of acoustic waves in the coupling regions is higher than the acoustic velocity in the outer busbar regions or the acoustic velocity in the center region.

In the acoustic wave device 1, of the above-described 11 regions A1 to A11, the regions A3, A9 respectively located at the third from two ends in the first direction D1 are inner busbar regions. The region A3 includes the inner busbar portion 42 of the first busbar 4. The region A9 includes the inner busbar portion 52 of the second busbar 5. The acoustic velocity of acoustic waves in the inner busbar regions is lower than the acoustic velocity in the center region.

In the acoustic wave device 1, of the above-described 11 regions A1 to A11, the regions A4, A8 respectively located at the fourth from two ends in the first direction D1 are gap regions. The region A4 includes the proximal end portions 63 of the plurality of first electrode fingers 6 and the plurality of gaps 32. The region A8 includes the proximal end portions 73 of the plurality of second electrode fingers 7 and the plurality of gaps 31. The acoustic velocity of acoustic waves in the gap regions is higher than the acoustic velocity in the inner busbar regions or the acoustic velocity in the center region.

In the acoustic wave device 1, of the above-described 11 regions A1 to A11, the regions A5, A7 respectively located at the fifth from two ends in the first direction D1 are wide regions. The region A5 includes the wide portions 64 of the plurality of first electrode fingers 6 and the wide portions 72 of the plurality of second electrode fingers 7. The region A7 includes the wide portions 62 of the plurality of first electrode fingers 6 and the wide portions 74 of the plurality of second electrode fingers 7. The acoustic velocity of acoustic waves in the wide regions is lower than the acoustic velocity in the center region.

In the acoustic wave device 1, since each interdigital transducer electrode 3 is preferably configured as described above, the low acoustic velocity regions (the regions A5, A3 and the regions A7, A9) are provided on the outer side of the center region (the region A6), and the high acoustic velocity regions A2, A10 are present on the outer side of the low acoustic velocity regions. Therefore, the acoustic wave device 1 is able to form a piston mode, so a transverse-mode ripple is effectively reduced or prevented.

(1.3) Potentials of Interdigital Transducer Electrodes and Reflectors

Figure 4:
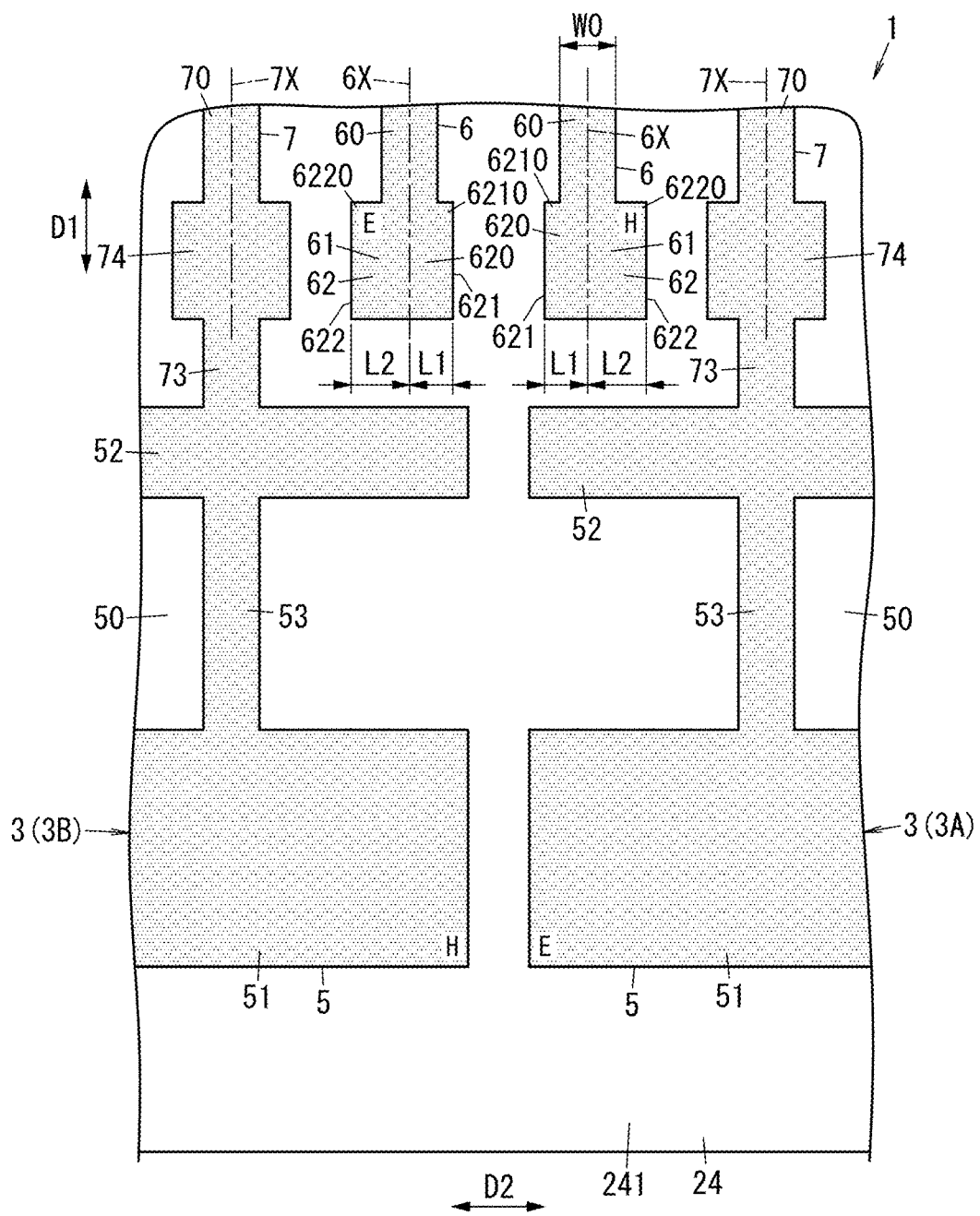
FIG. 4 is an enlarged view of a main portion of the above acoustic wave device.

FIG. 4 is an enlarged view including the first electrode finger 6 located at the left-side end of the center interdigital transducer electrode 3A in FIG. 1 and FIG. 2 and the first electrode finger 6 located at the right-side end of the left-side interdigital transducer electrode 3B in FIG. 1 and FIG. 2. In FIG. 1, FIG. 2, and FIG. 4, the high potential portions to which the label "H" is assigned are different in potential from the low potential portions to which the label "E" is assigned. For example, in FIG. 4, the first electrode finger 6 located at the left-side end of the interdigital transducer electrode 3A and the first electrode finger 6 located at the right-side end of the interdigital transducer electrode 3B are different in potential. In FIG. 4, the first electrode finger 6 located at the left-side end of the interdigital transducer electrode 3A and the second busbar 5 of the interdigital transducer electrode 3A, close to this first electrode finger 6, are different in potential. In FIG. 4, the first electrode finger 6 located at the right-side end of the interdigital transducer electrode 3B and the second busbar 5 of the interdigital transducer electrode 3B, close to this first electrode finger 6, are different in potential. The second busbar 5 of the interdigital transducer electrode 3A and the second busbar 5 of the interdigital transducer electrode 3B are different in potential.

Figure 6:
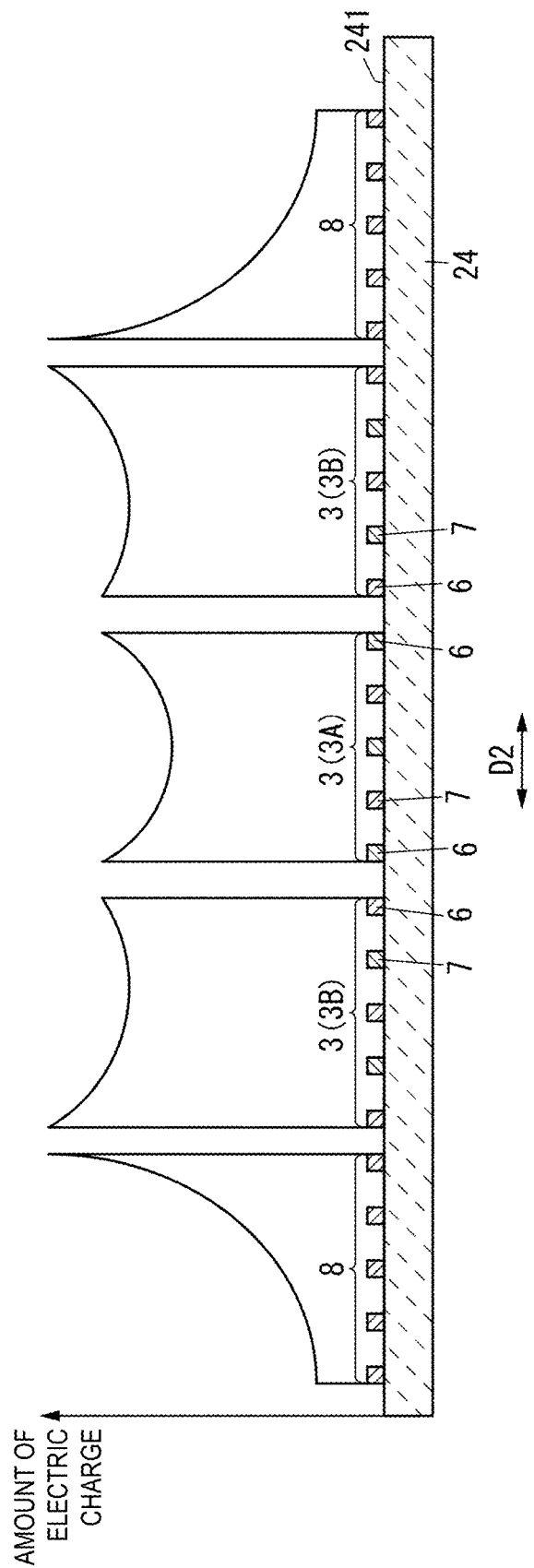
FIG. 6 is a view illustrating an electric charge distribution in the above acoustic wave device.
Figure 7:
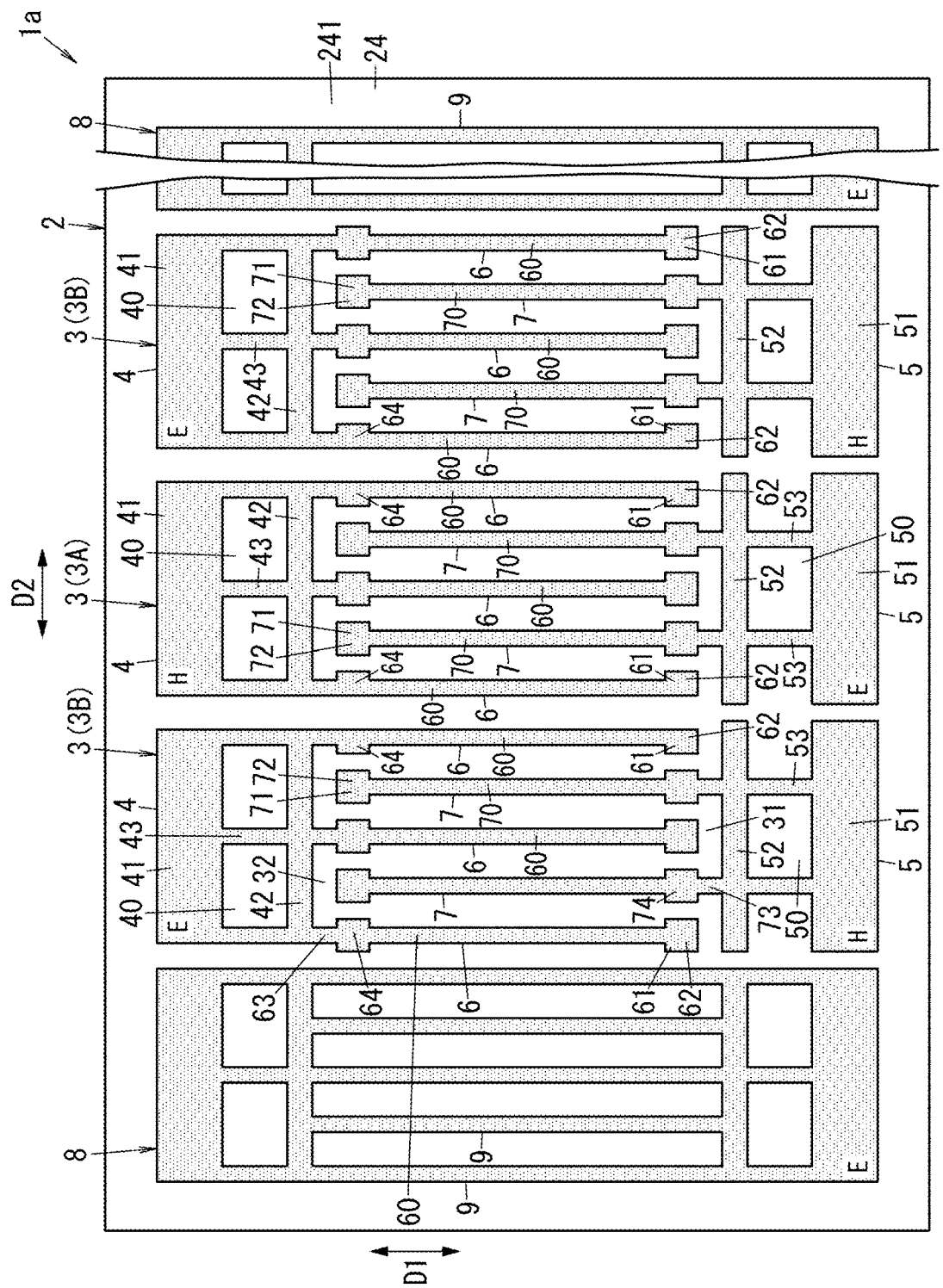
FIG. 7 is a plan view of portion of an acoustic wave device according to a first modification of the first preferred embodiment of the present invention.
Figure 8:
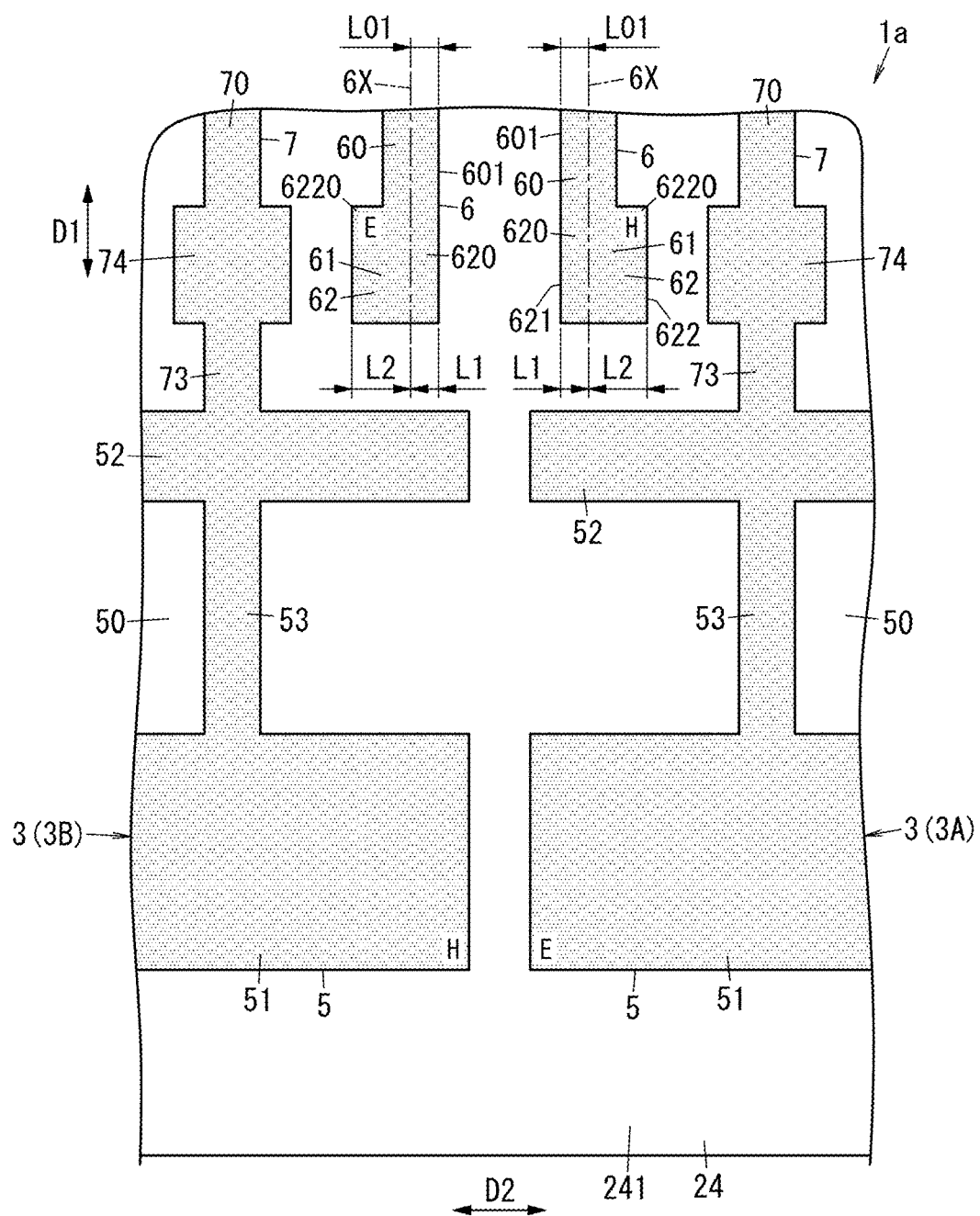
FIG. 8 is an enlarged view of a main portion of the above acoustic wave device.
Figure 9:
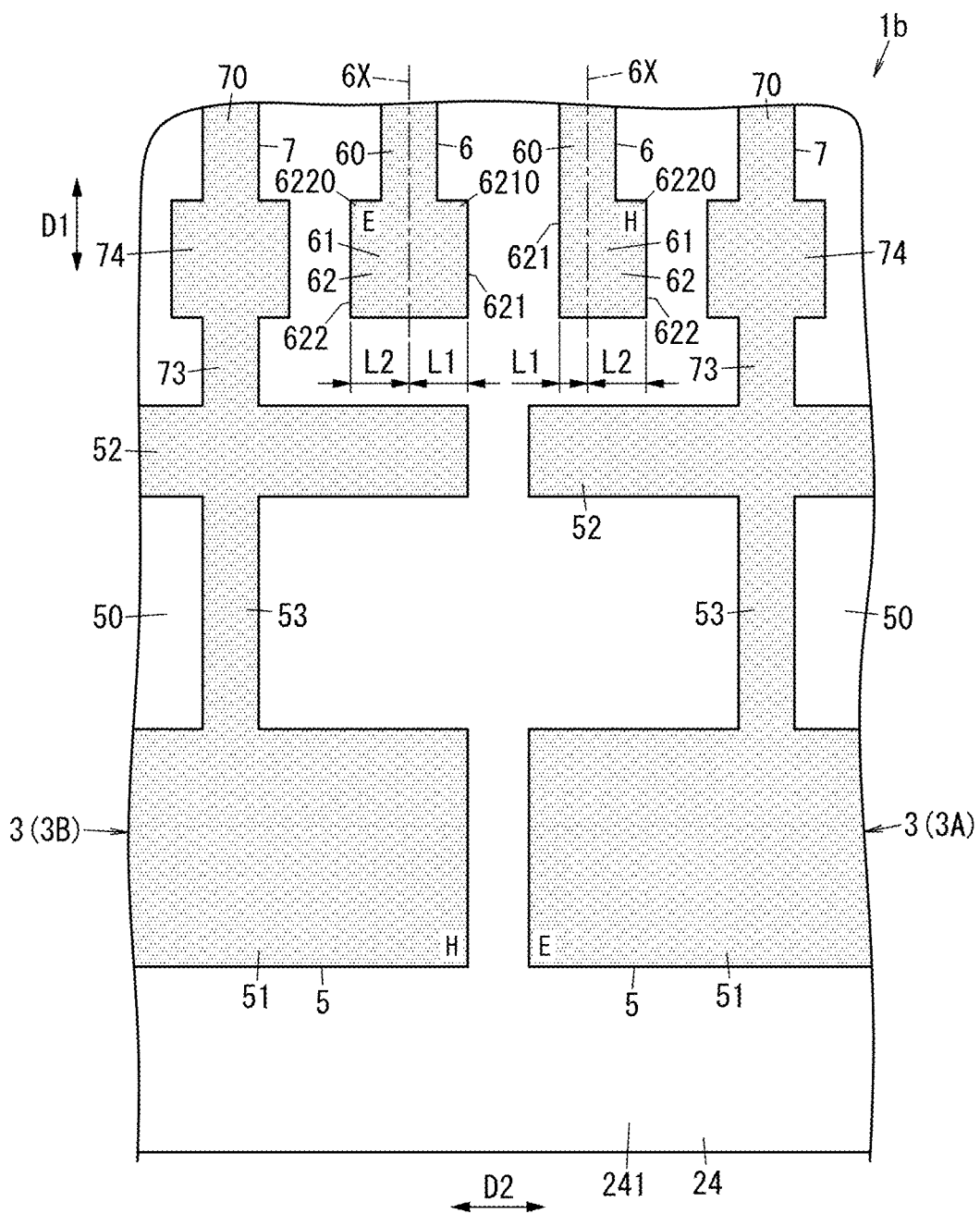
FIG. 9 is an enlarged view of a main portion of an acoustic wave device according to a second modification of the first preferred embodiment of the present invention.

FIG. 6 shows an electric charge distribution in the surface (including the surfaces of the three interdigital transducer electrodes 3 and the one main surface 241 of the piezoelectric body portion 24) of the acoustic wave device 1 according to the first preferred embodiment. A precondition for the electric charge distribution shown in FIG. 6 includes a condition that an excitation phenomenon of surface acoustic waves is occurring in the region associated with the interdigital transducer electrode 3A and the region associated with the interdigital transducer electrode 3B, a condition that the region associated with the interdigital transducer electrode 3A and the region associated with the interdigital transducer electrode 3B are respectively connected to different electrical terminals (the first terminal 11A and the first terminal 11B), a condition that each reflector 8 is electrically short-circuited (short-circuited grating), and a condition that no excitation phenomenon of surface acoustic waves is occurring in the region associated with the reflectors 8 (since the reflectors 8 are electrically short-circuited, a driving voltage that causes a piezoelectric effect is zero). Here, the principle that the electric charge distribution shown in FIG. 6 occurs is as follows. An edge effect (also referred to as cut-edge effect) occurs in a boundary region between a region where excitation of surface acoustic waves is occurring and a region where no excitation is occurring. An edge effect also occurs in a boundary region between two regions in which the states of excitation of surface acoustic waves are different from each other. Because of the edge effect, the amount of electric charge in a boundary region locally increases as compared to the amount of electric charge in regions around the boundary region. An edge effect, in principle, can occur in applicable various boundary regions when the states of excitation of surface acoustic waves are different from each other. However, in the case of the acoustic wave device 1 (which is preferably a longitudinally coupled resonator filter) according to the first preferred embodiment, as shown in FIG. 6, the amount of electric charge mostly locally concentrates in the boundary region between the region associated with the interdigital transducer electrode 3A and each region associated with the interdigital transducer electrode 3B and in the boundary region between each region associated with the interdigital transducer electrode 3B and the region associated with the reflector 8. Therefore, in the acoustic wave device 1 according to the first preferred embodiment, the electric charge distribution as shown in FIG. 6 occurs.

As is apparent from FIG. 6, in the acoustic wave device 1, in the second direction D2 in which a group of electrode fingers including the plurality of first electrode fingers 6 and the plurality of second electrode fingers 7 is arranged, the amount of electric charge at each end of the interdigital transducer electrode 3 is greater than the amount of electric charge in the center of the interdigital transducer electrode 3. For this reason, in the acoustic wave device 1, for example, the density of electric lines of force tends to increase between the adjacent interdigital transducer electrodes 3.

(1.4) Details of Interdigital Transducer Electrode

Where, of the plurality of interdigital transducer electrodes 3, one of the adjacent two interdigital transducer electrodes 3 in the second direction D2 is a first interdigital transducer electrode and the other is a second interdigital transducer electrode, for the first electrode finger 6 closest to the second interdigital transducer electrode (the interdigital transducer electrode 3B or the interdigital transducer electrode 3A) in the first interdigital transducer electrode (the interdigital transducer electrode 3A or the interdigital transducer electrode 3B), the first distance L1 is shorter than the second distance L2, for example, as shown in FIG. 4. The first distance L1 is the maximum distance in the second direction D2 between the center line 6X of the center portion 60 along the first direction D1 and the outer edge 621, closer to the second interdigital transducer electrode, of the wide portion 62. The second distance L2 is the maximum distance in the second direction D2 between the center line 6X and the outer edge 622, away from the second interdigital transducer electrode, of the wide portion 62. Where the width of the center portion 60 of the first electrode finger 6 in the second direction D2 is W0, the first distance L1 and the second distance L2 each are longer than W0/2. In the acoustic wave device 1 according to the first preferred embodiment, in a pair of the adjacent two interdigital transducer electrodes 3, when the interdigital transducer electrode 3A is a first interdigital transducer electrode, the interdigital transducer electrode 3B is a second interdigital transducer electrode; whereas, when the interdigital transducer electrode 3B is a first interdigital transducer electrode, the interdigital transducer electrode 3A is a second interdigital transducer electrode. The wide portion 62 of the first electrode finger 6 closest to the second interdigital transducer electrode in the first interdigital transducer electrode has two projecting portions 6210, 6220 that project from a portion 620 overlapping the center portion 60 in the first direction D1 toward opposite sides in the second direction D2 (see FIG. 4). The projecting portion 6210 projects toward the second interdigital transducer electrode beyond the center portion 60 in the second direction D2. The projecting portion 6220 projects toward the second electrode finger 7 away from the second interdigital transducer electrode beyond the center portion 60 in the second direction D2.

In the first interdigital transducer electrode, for the first electrode finger 6 closest to the second interdigital transducer electrode of a group of electrode fingers of the first interdigital transducer electrode, a third distance that is the maximum distance in the second direction D2 between the center line 6X and an outer edge, to the second interdigital transducer electrode, of the wide portion 64 is shorter than a fourth distance that is the maximum distance in the second direction D2 between the center line 6X and an outer edge, away from the second interdigital transducer electrode, of the wide portion 64. The third distance is the same as the first distance L1. The fourth distance is the same as the second distance L2. In the first interdigital transducer electrode, the first electrode finger 6 closest to the second interdigital transducer electrode of a group of electrode fingers of the first interdigital transducer electrode has an asymmetric shape with respect to the center line 6X. The shape of the wide portion 64 is the same or substantially the same as the shape of the wide portion 62.

In one of the adjacent two interdigital transducer electrodes 3, of a group of electrode fingers including the plurality of first electrode fingers 6 and the plurality of second electrode fingers 7, the first electrode finger 6 closest to the other interdigital transducer electrode 3 in the second direction D2 is located on an inner side in the second direction D2 relative to the second busbar 5.

In the first interdigital transducer electrode, each of the first electrode fingers 6 other than the first electrode finger 6 closest to the second interdigital transducer electrode of the plurality of first electrode fingers 6 preferably has a symmetric shape with respect to the center line 6X of the center portion 60 along the first direction D1. In the second interdigital transducer electrode, each of the first electrode fingers 6 other than the first electrode finger 6 closest to the first interdigital transducer electrode of the plurality of first electrode fingers 6 preferably has a symmetric shape with respect to the center line 6X of the center portion 60 along the first direction D1. In the first electrode fingers 6 other than the first electrode finger 6 closest to the second interdigital transducer electrode of the plurality of first electrode fingers 6, the distance in the second direction D2 between the center line 6X of the center portion 60 along the first direction D1 and one outer edge of the wide portion 62 and the distance in the second direction D2 between the center line 6X and the other edge of the wide portion 62 are the same or substantially the same as the second distance L2. Therefore, in the first interdigital transducer electrode, of the plurality of first electrode fingers 6, the width (first distance L1+second distance L2), in the second direction D2, of the wide portion 62 of the first electrode finger 6 closest to the second interdigital transducer electrode is narrower than the width, in the second direction D2, of the wide portion 62 of another one of the first electrode fingers 6.

In the first interdigital transducer electrode, each of the plurality of second electrode fingers 7 preferably has a line-symmetric shape with respect to the center line 7X (see FIG. 4) of the center portion 70 along the first direction D1. In the second interdigital transducer electrode, each of the plurality of second electrode fingers 7 has a line-symmetric shape with respect to the center line 7X of the center portion 70 along the first direction D1. In each of the plurality of second electrode fingers 7, the distance in the second direction D2 between the center line 7X of the center portion 70 along the first direction D1 and one outer edge of the wide portion 72 and the distance in the second direction D2 between the center line 7X and the other outer edge of the wide portion 72 are the same or substantially the same as the second distance L2.

(1.5) Advantageous Effects

The acoustic wave device 1 according to the first preferred embodiment includes the first terminals 11, the second terminals 12, the piezoelectric body portion 24, and the plurality of interdigital transducer electrodes 3. Each second terminal 12 has a lower potential than each first terminal 11. The plurality of interdigital transducer electrodes 3 are provided on or above the piezoelectric body portion 24 and electrically connected to the first terminals 11 and the second terminals 12. Each of the plurality of interdigital transducer electrodes 3 includes the first busbar 4, the second busbar 5, the plurality of first electrode fingers 6, and the plurality of second electrode fingers 7. The second busbar 5 is opposed to the first busbar 4 in the first direction D1. The plurality of first electrode fingers 6 are connected to the first busbar 4 and extend from the first busbar 4 toward the second busbar 5 in the first direction D1. The plurality of second electrode fingers 7 are connected to the second busbar 5 and extend from the second busbar 5 toward the first busbar 4 in the first direction D1. The plurality of first electrode fingers 6 and the plurality of second electrode fingers 7 are arranged so as to be spaced apart from each other in the second direction D2 perpendicular or substantially perpendicular to the first direction D1. The first busbar 4 includes the opening portions 40, the inner busbar portion 42, the outer busbar portion 41, and the coupling portions 43. The second busbar 5 includes the opening portions 50, the inner busbar portion 52, the outer busbar portion 51, and the coupling portions 53. The inner busbar portion 42 is located closer to a group of electrode fingers including the plurality of first electrode fingers 6 and the plurality of second electrode fingers 7 than the opening portions 40 in the first direction D1. The inner busbar portion 52 is located closer to a group of electrode fingers including the plurality of first electrode fingers 6 and the plurality of second electrode fingers 7 than the opening portions 50 in the first direction D1. The outer busbar portion 41 is located across the opening portions 40 from the inner busbar portion 42 in the first direction D1. The outer busbar portion 51 is located across the opening portions 50 from the inner busbar portion 52 in the first direction D1. The coupling portions 43 couple the inner busbar portion 42 and the outer busbar portion 41 in the first direction D1. The coupling portions 53 couple the inner busbar portion 52 and the outer busbar portion 51 in the first direction D1. Where, of the plurality of interdigital transducer electrodes 3, one of the adjacent two interdigital transducer electrodes 3 in the second direction D2 is a first interdigital transducer electrode and the other is a second interdigital transducer electrode, one of the electrode finger (the first electrode finger 6) closest to the second interdigital transducer electrode of a group of electrode fingers of the first interdigital transducer electrode and the electrode finger (the first electrode finger 6) closest to the first interdigital transducer electrode of a group of electrode fingers of the second interdigital transducer electrode is connected to the first terminals 11, and the other is connected to the second terminals 12. In the first interdigital transducer electrode, the first electrode finger 6 closest to the second interdigital transducer electrode of the group of electrode fingers includes the wide portion 62 that has a greater width in the second direction D2 than the center portion 60, in the first direction D1, of the first electrode finger 6 closest to the second interdigital transducer electrode. In the first interdigital transducer electrode, for the first electrode finger 6 closest to the second interdigital transducer electrode, the first distance L1 that is the maximum distance in the second direction D2 between the center line 6X of the center portion 60 along the first direction D1 and the outer edge 621, closer to the second interdigital transducer electrode, of the wide portion 62 is shorter than the second distance L2 that is the maximum distance in the second direction D2 between the center line 6X and the outer edge 622, away from the second interdigital transducer electrode, of the wide portion 62.

Thus, with the acoustic wave device 1 according to the first preferred embodiment, the interdigital transducer electrode 3 has the above-described configuration, such interference with a piston mode is reduced or prevented. With the acoustic wave device 1 according to the first preferred embodiment, in the first interdigital transducer electrode, for the first electrode finger 6 closest to the second interdigital transducer electrode, the first distance L1 is shorter than the second distance L2. Therefore, a surge breakdown due to ESD between the adjacent interdigital transducer electrodes 3 is recued or prevented. Specifically, with the acoustic wave device 1 according to the first preferred embodiment, a surge breakdown resulting from occurrence of ESD between the first electrode fingers 6 of the interdigital transducer electrodes 3 of the adjacent resonators is reduced or prevented. Thus, with the acoustic wave device 1 according to the first preferred embodiment, ESD tolerance is improved while interference with a piston mode is reduced or prevented.

With the acoustic wave device 1 according to the first preferred embodiment, the width, in the second direction D2, of the wide portion 62 of only the first electrode finger 6 closest to the second interdigital transducer electrode in the first interdigital transducer electrode is narrower than the width, in the second direction D2, of each of the wide portions 62 of the other first electrode fingers 6. Thus, ESD tolerance is improved. Thus, with the acoustic wave device 1 according to the first preferred embodiment, ESD tolerance is improved while interference with a piston mode is further reduced or prevented.

(1.6) First Modification of First Preferred Embodiment

Hereinafter, an acoustic wave device 1a according to a first modification of the first preferred embodiment will be described with reference to the drawings.

The acoustic wave device 1a according to the first modification differs from the acoustic wave device 1 according to the first preferred embodiment in the shape of each of the wide portions 62, 64 of the first electrode fingers 6 closest to the second interdigital transducer electrode (the interdigital transducer electrode 3A or the interdigital transducer electrode 3B) in the first interdigital transducer electrode (the interdigital transducer electrode 3A or the interdigital transducer electrode 3B). As for the acoustic wave device 1a according to the first modification, like reference numerals denote the same or similar components to those of the acoustic wave device 1 (see FIG. 1 to FIG. 6) according to the first preferred embodiment, and the description thereof is omitted as needed.

In the acoustic wave device 1 according to the first preferred embodiment, for example, as shown in FIG. 4, the wide portion 62 of the first electrode finger 6 closest to the second interdigital transducer electrode (the interdigital transducer electrode 3B or the interdigital transducer electrode 3A) in the first interdigital transducer electrode (the interdigital transducer electrode 3A or the interdigital transducer electrode 3B) includes the two projecting portions 6210, 6220 that respectively project toward opposite sides in the second direction D2. In contrast to this, in the acoustic wave device 1a according to the first modification, the wide portion 62 of the first electrode finger 6 closest to the second interdigital transducer electrode (the interdigital transducer electrode 3B or the interdigital transducer electrode 3A) in the first interdigital transducer electrode (the interdigital transducer electrode 3A or the interdigital transducer electrode 3B) has only the projecting portion 6220 of the two projecting portions 6210, 6220 (see FIG. 4).

In the first interdigital transducer electrode of the acoustic wave device 1a according to the first modification, for the first electrode finger 6 closest to the second interdigital transducer electrode, the first distance L1 is preferably the same or substantially the same as a distance L01 in the second direction D2 between the center line 6X of the center portion 60 and the outer edge 601, closer to the second interdigital transducer electrode, of the center portion 60.

Thus, with the acoustic wave device 1a according to the first modification, as compared to the acoustic wave device 1 according to the first preferred embodiment, the distance between the adjacent two first electrode fingers 6 between the adjacent two interdigital transducer electrodes 3 in the second direction D2 is extended. Thus, with the acoustic wave device 1a according to the first modification, as compared to the acoustic wave device 1 according to the first preferred embodiment, ESD tolerance is further improved while interference with a piston mode is further reduced or prevented.

(1.7) Second Modification of First Preferred Embodiment

Hereinafter, an acoustic wave device 1b according to a second modification of the first preferred embodiment will be described with reference to the drawings.

The acoustic wave device 1b according to the second modification differs from the acoustic wave device 1 according to the first preferred embodiment in that, in only one interdigital transducer electrode 3 (the interdigital transducer electrode 3A) of the adjacent two interdigital transducer electrodes 3 in the second direction D2, for the wide portion 62 of the first electrode finger 6 closest to the other interdigital transducer electrode 3 (the interdigital transducer electrode 3B), the first distance L1 is shorter than the second distance L2. As for the acoustic wave device 1b according to the second modification, like reference numerals denote the same or similar components to those of the acoustic wave device 1 (see FIG. 1 to FIG. 6) according to the first preferred embodiment, and the description thereof is omitted as needed.

In the acoustic wave device 1b according to the second modification, in the other interdigital transducer electrode 3 (the interdigital transducer electrode 3B) of the adjacent two interdigital transducer electrodes 3 in the second direction D2, for the wide portion 62 of the first electrode finger 6 closest to the one interdigital transducer electrode (the interdigital transducer electrode 3A), the first distance L1 is preferably the same as the second distance L2. In the acoustic wave device 1b according to the second modification, in a pair of the adjacent two interdigital transducer electrodes 3, the interdigital transducer electrode 3A is a first interdigital transducer electrode, and the interdigital transducer electrode 3B is a second interdigital transducer electrode.

With the acoustic wave device 1b according to the second modification, for the wide portion 62 of the first electrode finger 6 closest to the interdigital transducer electrode 3B in the interdigital transducer electrode 3A, the first distance L1 is shorter than the second distance L2. Therefore, ESD tolerance is improved while interference with a piston mode is reduce or prevented. With the acoustic wave device 1b according to the second modification, for the wide portion 62 of the first electrode finger 6 closest to the interdigital transducer electrode 3A in the first interdigital transducer electrode 3B, the first distance L1 is the same as the second distance L2, so interference with a piston mode is further reduced or prevented as compared to the acoustic wave device 1 according to the first preferred embodiment.

(1.8) Third Modification of First Preferred Embodiment

Figure 10:
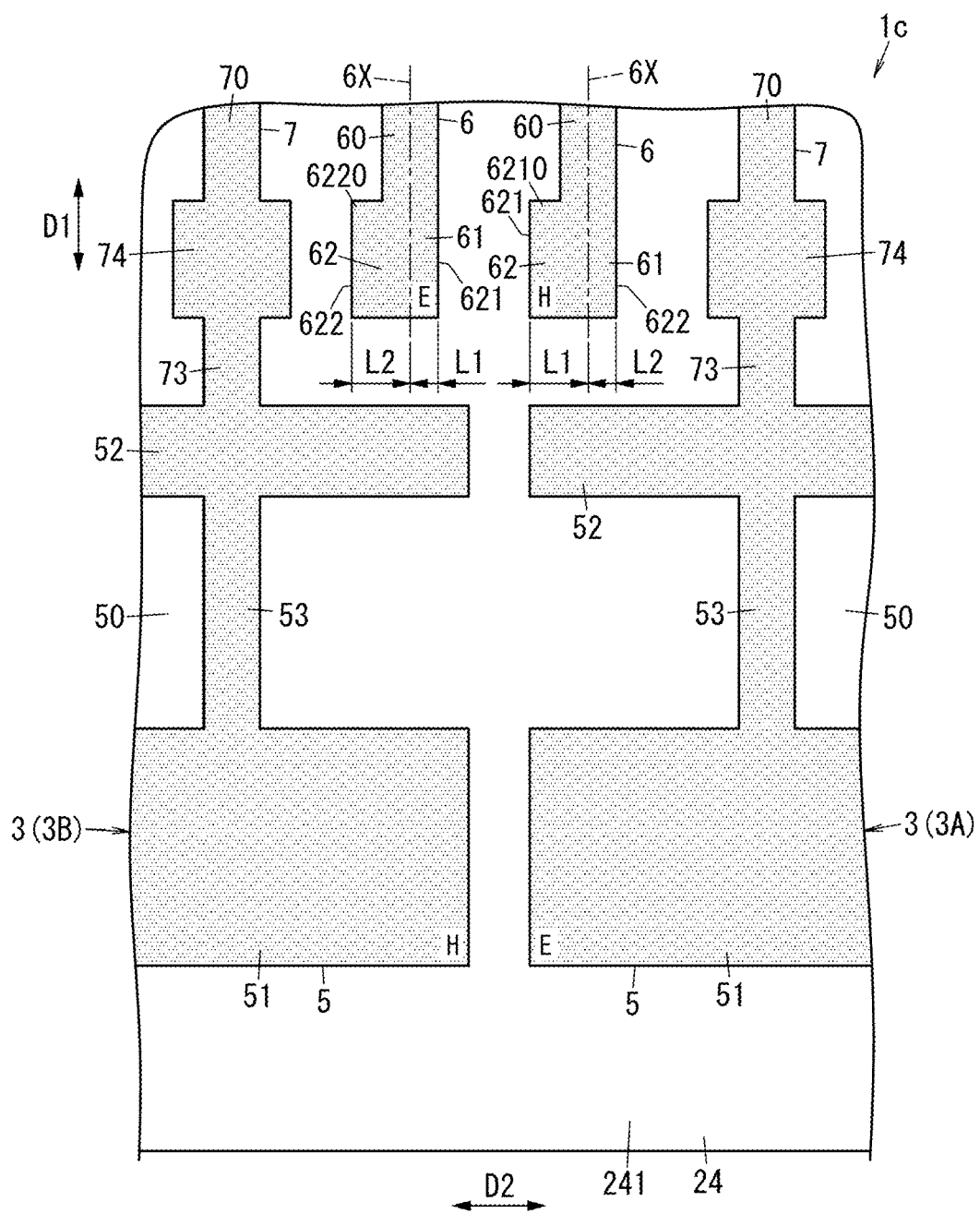
FIG. 10 is an enlarged view of a main portion of an acoustic wave device according to a third modification of the first preferred embodiment of the present invention.

Hereinafter, an acoustic wave device 1c according to a third modification of the first preferred embodiment will be described with reference to FIG. 10.

The acoustic wave device 1c according to the third modification differs from the acoustic wave device 1 according to the first preferred embodiment in that, in only one interdigital transducer electrode 3 (the interdigital transducer electrode 3B) of the adjacent two interdigital transducer electrodes 3 in the second direction D2, for the wide portion 62 of the first electrode finger 6 closest to the other interdigital transducer electrode 3 (the interdigital transducer electrode 3A), the first distance L1 is shorter than the second distance L2. As for the acoustic wave device 1c according to the third modification, like reference numerals denote similar components to those of the acoustic wave device 1 (see FIG. 1 to FIG. 6) according to the first preferred embodiment, and the description thereof is omitted as needed.

In the acoustic wave device 1c according to the third modification, in the other interdigital transducer electrode 3 (the interdigital transducer electrode 3A) of the adjacent two interdigital transducer electrodes 3 in the second direction D2, for the wide portion 62 of the first electrode finger 6 closest to the one interdigital transducer electrode (the interdigital transducer electrode 3B), the second distance L2 is preferably shorter than the first distance L1. In the acoustic wave device 1c according to the third modification, in a pair of the adjacent two interdigital transducer electrodes 3, the interdigital transducer electrode 3B is a first interdigital transducer electrode, and the interdigital transducer electrode 3A is a second interdigital transducer electrode.

With the acoustic wave device 1c according to the third modification, for the wide portion 62 of the first electrode finger 6 closest to the interdigital transducer electrode 3A in the interdigital transducer electrode 3B, the first distance L1 is preferably shorter than the second distance L2. Therefore, ESD tolerance is improved while interference with a piston mode is reduced or prevented.

(1.9) Other Modifications of First Preferred Embodiment

The number of the plurality of first electrode fingers 6 and the number of the plurality of second electrode fingers 7 in the interdigital transducer electrode 3 of each of the plurality of interdigital transducer electrodes 3 are not limited. Here, in the interdigital transducer electrode 3, the electrode fingers respectively located at one end and the other end in the second direction D2 of the group of electrode fingers are not limited to the first electrode fingers 6. For example, of the group of electrode fingers, the electrode finger located at one end in the second direction D2 may be the first electrode finger 6, and the electrode finger located at the other end may be the second electrode finger 7. Of the group of electrode fingers, the electrode fingers respectively located at one end and the other end in the second direction D2 may be the second electrode fingers 7. The group of electrode fingers just needs to have such a configuration that the plurality of first electrode fingers 6 and the plurality of second electrode fingers 7 are arranged so as to be spaced apart from each other in the second direction D2 perpendicular to the first direction D1. For example, in an acoustic wave device of one modification, a region in which the first electrode finger 6 and the second electrode finger 7 are arranged one by one so as to be spaced apart from each other and a region in which the two first electrode fingers 6 or the two second electrode fingers 7 are arranged in the second direction D2 may be mixed. In the acoustic wave device of any one of these modifications as well, in at least one interdigital transducer electrode 3 of the adjacent two interdigital transducer electrodes 3 in the second direction D2, for the wide portion of the electrode finger closest to the other interdigital transducer electrode 3 in the second direction D2 of a group of electrode fingers, the first distance L1 only needs to be shorter than the second distance L2. Thus, with the acoustic wave device of any one of these modifications, ESD tolerance is improved while interference with a piston mode is reduced or prevented. At least one first electrode finger 6 of the plurality of first electrode fingers 6 in each interdigital transducer electrode 3 only needs to have the wide portion 62, and at least one second electrode finger 7 of the plurality of second electrode fingers 7 in each interdigital transducer electrode 3 just needs to have the wide portion 72.

Second Preferred Embodiment (2.1) Configuration of Acoustic Wave Device

Figure 11:
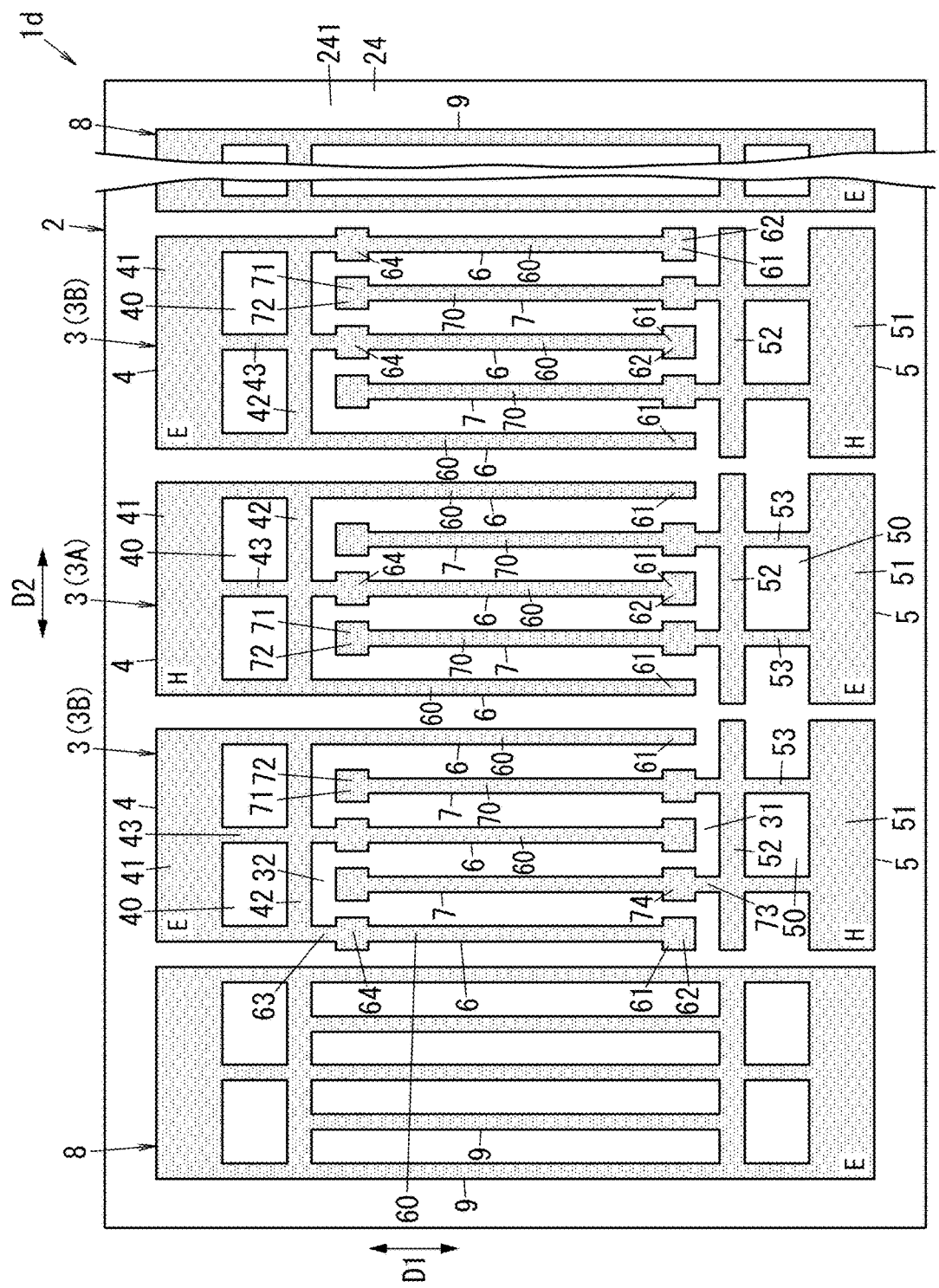
FIG. 11 is a plan view of a portion of an acoustic wave device according to a second preferred embodiment of the present invention.
Figure 12:
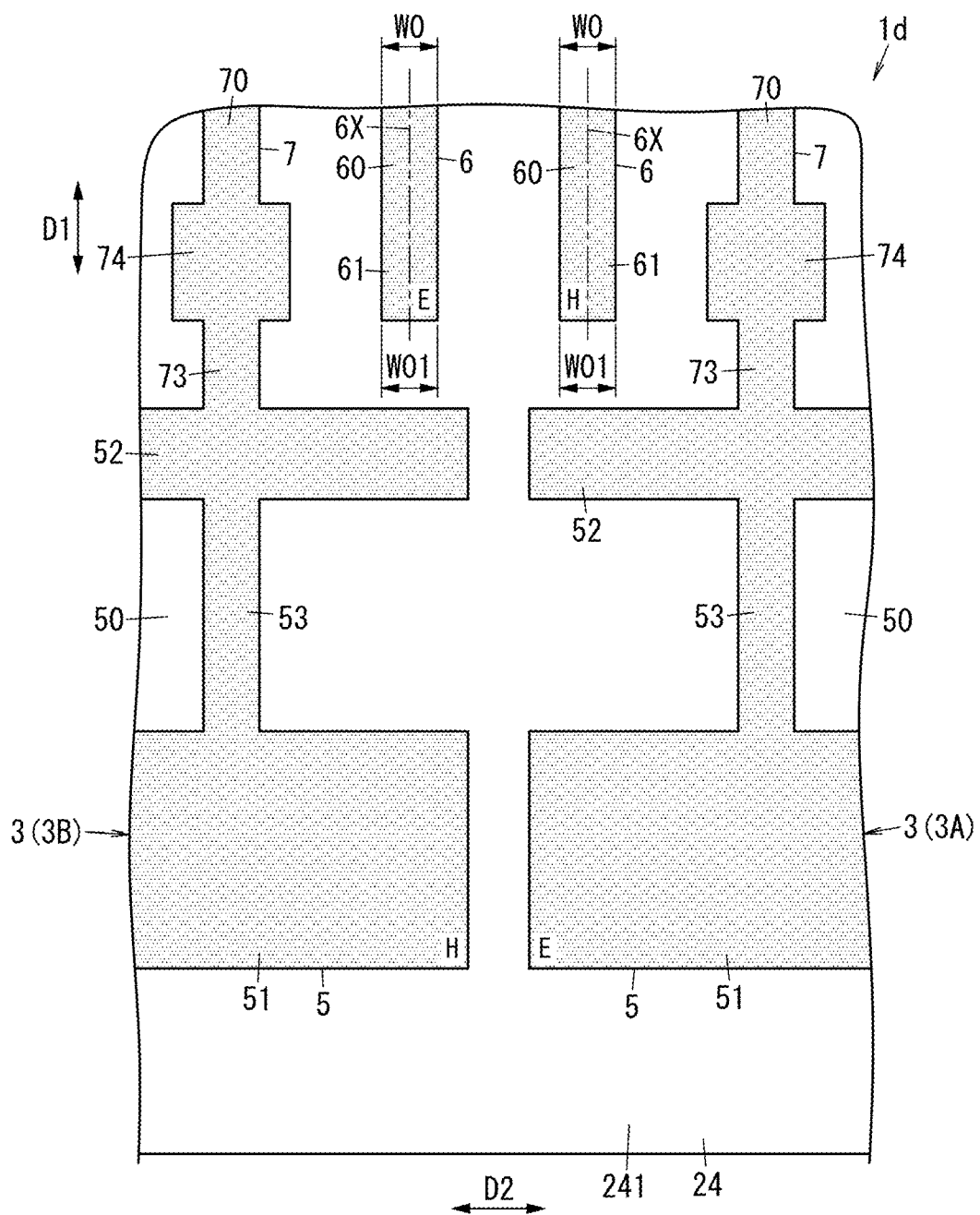
FIG. 12 is an enlarged view of a main portion of the above acoustic wave device.

Hereinafter, an acoustic wave device 1d according to a second preferred embodiment of the present invention will be described with reference to FIG. 11 and FIG. 12.

The acoustic wave device 1d according to the second preferred embodiment differs from the acoustic wave device 1 according to the first preferred embodiment in that, in one interdigital transducer electrode 3 (the interdigital transducer electrode 3B or the interdigital transducer electrode 3A) of the adjacent two interdigital transducer electrodes 3, a width W01, in the second direction D2, of the distal end portion 61 of the first electrode finger 6 closest to the other interdigital transducer electrode 3 (the interdigital transducer electrode 3B or the interdigital transducer electrode 3A) is preferably the same or substantially the same as a width W0 of the center portion 60. As for the acoustic wave device 1d according to the second preferred embodiment, like reference numerals denote the same or similar components to those of the acoustic wave device 1 (see FIG. 1 to FIG. 6) according to the first preferred embodiment, and the description thereof is omitted as needed.

In the acoustic wave device 1d according to the second preferred embodiment, in one interdigital transducer electrode (the interdigital transducer electrode 3A or the interdigital transducer electrode 3B) of the adjacent two interdigital transducer electrodes 3, the first electrode finger 6 closest to the other interdigital transducer electrode 3 (the interdigital transducer electrode 3B or the interdigital transducer electrode 3A) includes no wide portion 62 (see FIG. 2) at the distal end portion 61. Thus, in the first electrode finger 6, the width W01 of the distal end portion 61 in the second direction D2 is preferably the same or substantially the same as the width W0 of the center portion 60. In addition, this first electrode finger 6 preferably does not include any wide portion 64 (see FIG. 2).

(2.2) Advantageous Effects

The acoustic wave device 1d according to the second preferred embodiment includes the first terminals 11 (see FIG. 1), the second terminals 12 (see FIG. 1), the piezoelectric body portion 24, and the plurality of interdigital transducer electrodes 3. Each second terminal 12 has a lower potential than each first terminal 11. The plurality of interdigital transducer electrodes 3 are provided on or above the piezoelectric body portion 24 and electrically connected to the first terminals 11 and the second terminals 12. Each of the plurality of interdigital transducer electrodes 3 includes the first busbar 4, the second busbar 5, the plurality of first electrode fingers 6, and the plurality of second electrode fingers 7. The second busbar 5 is opposed to the first busbar 4 in the first direction D1. The plurality of first electrode fingers 6 are connected to the first busbar 4 and extend from the first busbar 4 toward the second busbar 5 in the first direction D1. The plurality of second electrode fingers 7 are connected to the second busbar 5 and extended from the second busbar 5 toward the first busbar 4 in the first direction D1. The plurality of first electrode fingers 6 and the plurality of second electrode fingers 7 are spaced apart from each other in the second direction D2 perpendicular or substantially perpendicular to the first direction D1. The first busbar 4 includes the opening portions 40, the inner busbar portion 42, the outer busbar portion 41, and the coupling portions 43. The second busbar 5 includes the opening portions 50, the inner busbar portion 52, the outer busbar portion 51, and the coupling portions 53. The inner busbar portion 42 is located closer to a group of electrode fingers including the plurality of first electrode fingers 6 and the plurality of second electrode fingers 7 than the opening portions 40 in the first direction D1. The inner busbar portion 52 is located closer to a group of electrode fingers including the plurality of first electrode fingers 6 and the plurality of second electrode fingers 7 than the opening portions 50 in the first direction D1. The outer busbar portion 41 is located across the opening portions 40 from the inner busbar portion 42 in the first direction D1. The outer busbar portion 51 is located across the opening portions 50 from the inner busbar portion 52 in the first direction D1. The coupling portions 43 couple the inner busbar portion 42 and the outer busbar portion 41 in the first direction D1. The coupling portions 53 couple the inner busbar portion 52 and the outer busbar portion 51 in the first direction D1. At least one first electrode finger 6 of the plurality of first electrode fingers 6 includes the wide portion 62 having a greater width in the second direction D2 than the center portion 60 in the first direction D1. At least one second electrode finger 7 of the plurality of second electrode fingers 7 preferably includes the wide portion 72 having a greater width in the second direction D2 than the center portion 70 in the first direction D1. Where, of the plurality of interdigital transducer electrodes 3, one of the adjacent two interdigital transducer electrodes 3 in the second direction D2 is a first interdigital transducer electrode and the other is a second interdigital transducer electrode, one of the electrode finger (the first electrode finger 6) closest to the second interdigital transducer electrode of a group of electrode fingers of the first interdigital transducer electrode and the electrode finger (the first electrode finger 6) closest to the first interdigital transducer electrode of a group of electrode fingers of the second interdigital transducer electrode is connected to the first terminals 11, and the other is connected to the second terminals 12. In the first interdigital transducer electrode, the electrode finger 6 closest to the second interdigital transducer electrode does not have the wide portion 62, and at least one of the electrode fingers 6 other than the first electrode finger 6 closest to the second interdigital transducer electrode has the wide portion 62.

Thus, with the acoustic wave device 1d according to the second preferred embodiment, the interdigital transducer electrodes 3 have the above-described configuration, such interference with a piston mode is reduced or prevented. With the acoustic wave device 1d according to the second preferred embodiment, in the first interdigital transducer electrode, the first electrode finger 6 closest to the second interdigital transducer electrode does not include the wide portion 62, and at least one of the first electrode fingers 6 other than the first electrode finger 6 closest to the second interdigital transducer electrode includes the wide portion 62. Therefore, a surge breakdown due to ESD between the adjacent interdigital transducer electrodes 3 is reduced or prevented. Specifically, with the acoustic wave device 1d according to the second preferred embodiment, a surge breakdown resulting from occurrence of ESD between the first electrode fingers 6 of the interdigital transducer electrodes 3 of the adjacent resonators is reduced or prevented. Thus, with the acoustic wave device 1d according to the second preferred embodiment, ESD tolerance is improved while interference with a piston mode is reduced or prevented.

(2.3) First Modification of Second Preferred Embodiment

Figure 13:
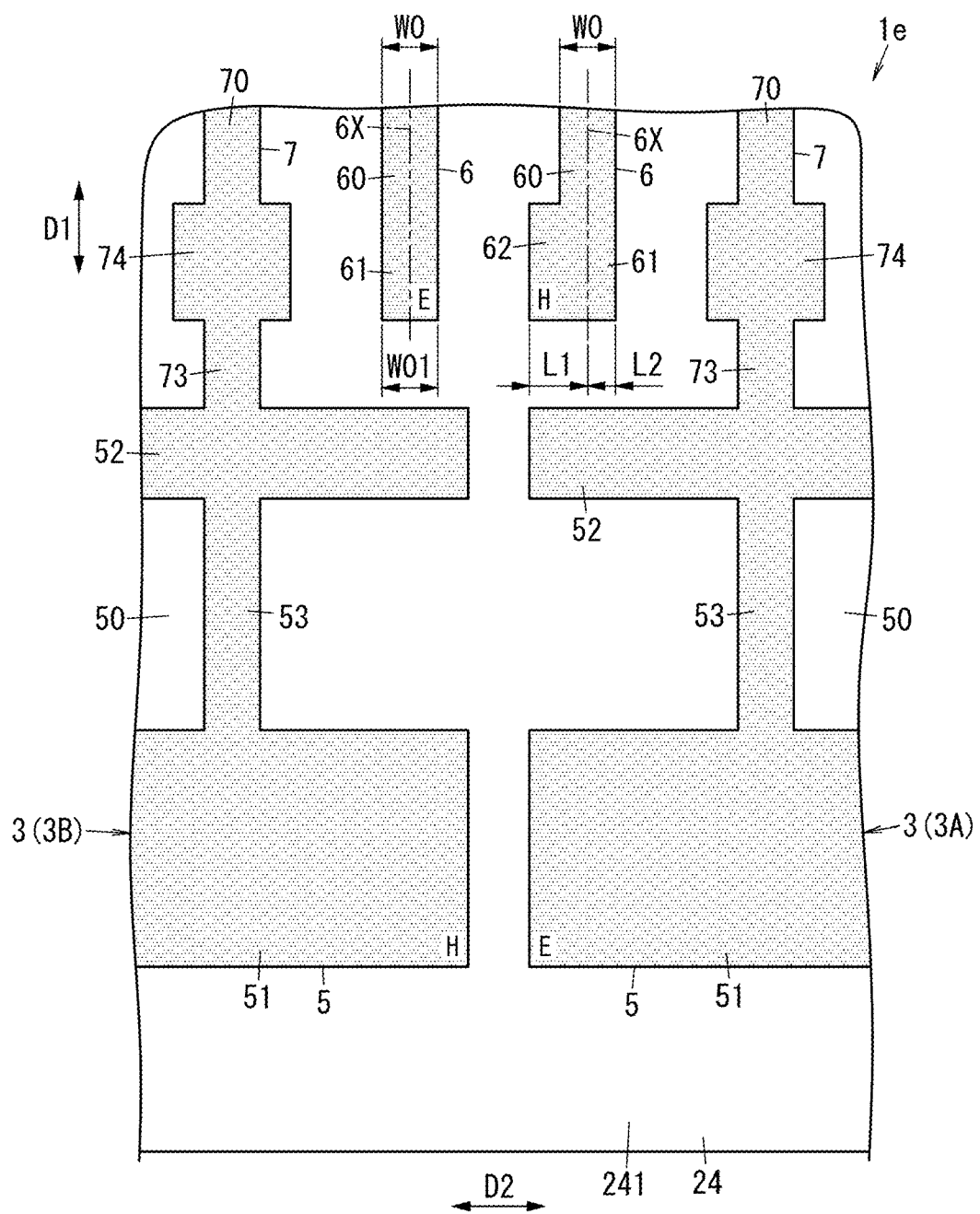
FIG. 13 is an enlarged view of a main portion of an acoustic wave device according to a first modification of the second preferred embodiment of the present invention.

Hereinafter, an acoustic wave device 1e according to a first modification of the second preferred embodiment will be described with reference to FIG. 13.

The acoustic wave device 1e according to the first modification differs from the acoustic wave device 1d according to the second preferred embodiment in that, only in one interdigital transducer electrode 3 (the interdigital transducer electrode 3B) of the adjacent two interdigital transducer electrodes 3 in the second direction D2, the width W01, in the second direction D2, of the distal end portion 61 of the first electrode finger 6 closest to the other interdigital transducer electrode 3 (the interdigital transducer electrode 3A) is preferably the same or substantially the same as the width W0 of the center portion 60. As for the acoustic wave device 1e according to the first modification, like reference numerals denote the same or similar components to those of the acoustic wave device 1d (see FIG. 11 and FIG. 12) according to the second preferred embodiment, and the description thereof is omitted as needed.

In the acoustic wave device 1e according to the first modification, in the other interdigital transducer electrode 3 (the interdigital transducer electrode 3A) of the adjacent two interdigital transducer electrodes 3 in the second direction D2, for the wide portion 62 of the first electrode finger 6 closest to the one interdigital transducer electrode (the interdigital transducer electrode 3B), the second distance L2 is shorter than the first distance L1. In the acoustic wave device 1e according to the first modification, in a pair of the adjacent two interdigital transducer electrodes 3, the interdigital transducer electrode 3B is a first interdigital transducer electrode, and the interdigital transducer electrode 3A is a second interdigital transducer electrode.

With the acoustic wave device 1e according to the first modification, the distal end portion 61 of the first electrode finger 6 closest to the interdigital transducer electrode 3B in the interdigital transducer electrode 3A has the wide portion 62. Therefore, as compared to the acoustic wave device 1d according to the second preferred embodiment, interference with a piston mode in the interdigital transducer electrode 3A is further reduced or prevented.

(2.4) Second Modification of Second Preferred Embodiment

Figure 14:
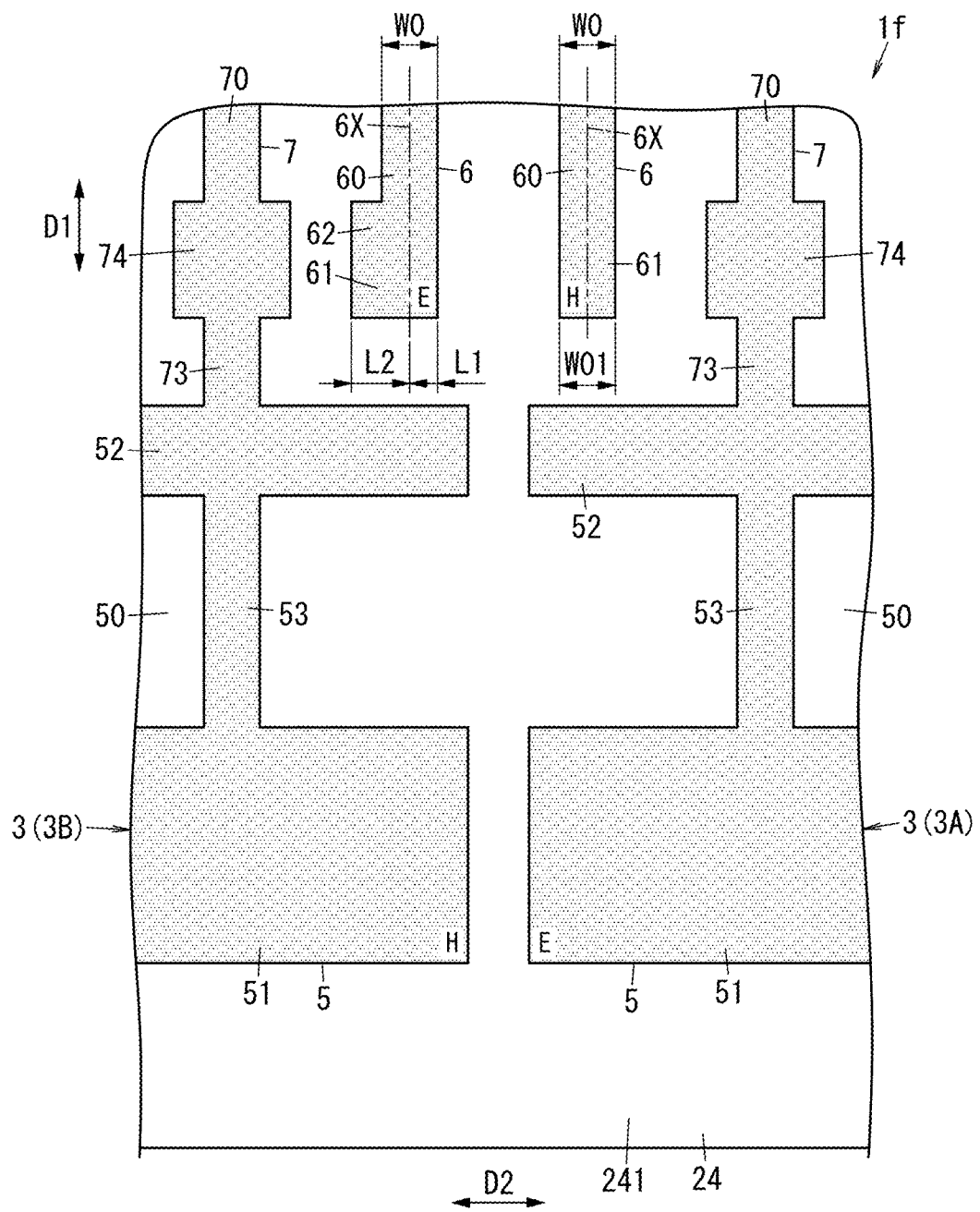
FIG. 14 is an enlarged view of a main portion of an acoustic wave device according to a second modification of the second preferred embodiment of the present invention.

Hereinafter, an acoustic wave device 1f according to a second modification of the second preferred embodiment will be described with reference to FIG. 14.

The acoustic wave device 1f according to the second modification differs from the acoustic wave device 1d according to the second preferred embodiment in that, only in one interdigital transducer electrode 3 (the interdigital transducer electrode 3A) of the adjacent two interdigital transducer electrodes 3 in the second direction D2, the width W01, in the second direction D2, of the distal end portion 61 of the first electrode finger 6 closest to the other interdigital transducer electrode 3 (the interdigital transducer electrode 3B) is preferably the same or substantially the same as the width W0 of the center portion 60. As for the acoustic wave device if according to the second modification, like reference numerals denote the same or similar components to those of the acoustic wave device 1d (see FIG. 11 and FIG. 12) according to the second preferred embodiment, and the description thereof is omitted as needed.

In the acoustic wave device if according to the second modification, in the other interdigital transducer electrode 3 (the interdigital transducer electrode 3B) of the adjacent two interdigital transducer electrodes 3 in the second direction D2, for the wide portion 62 of the first electrode finger 6 closest to the one interdigital transducer electrode (the interdigital transducer electrode 3A), the first distance L1 is shorter than the second distance L2. In the acoustic wave device if according to the second modification, in a pair of the adjacent two interdigital transducer electrodes 3, the interdigital transducer electrode 3A is a first interdigital transducer electrode, and the interdigital transducer electrode 3B is a second interdigital transducer electrode.

With the acoustic wave device if according to the second modification, the distal end portion 61 of the first electrode finger 6 closest to the interdigital transducer electrode 3A in the interdigital transducer electrode 3B preferably includes the wide portion 62. Therefore, as compared to the acoustic wave device 1d according to the second preferred embodiment, interference with a piston mode in the interdigital transducer electrode 3B is further reduced or prevented. With the acoustic wave device 1f according to the second modification, as compared to the acoustic wave device 1e according to the first modification, the shortest distance between the adjacent first electrode fingers 6 of the adjacent two interdigital transducer electrodes 3 is extended, such that ESD tolerance is improved.

(2.5) Third Modification of Second Preferred Embodiment

Figure 15:
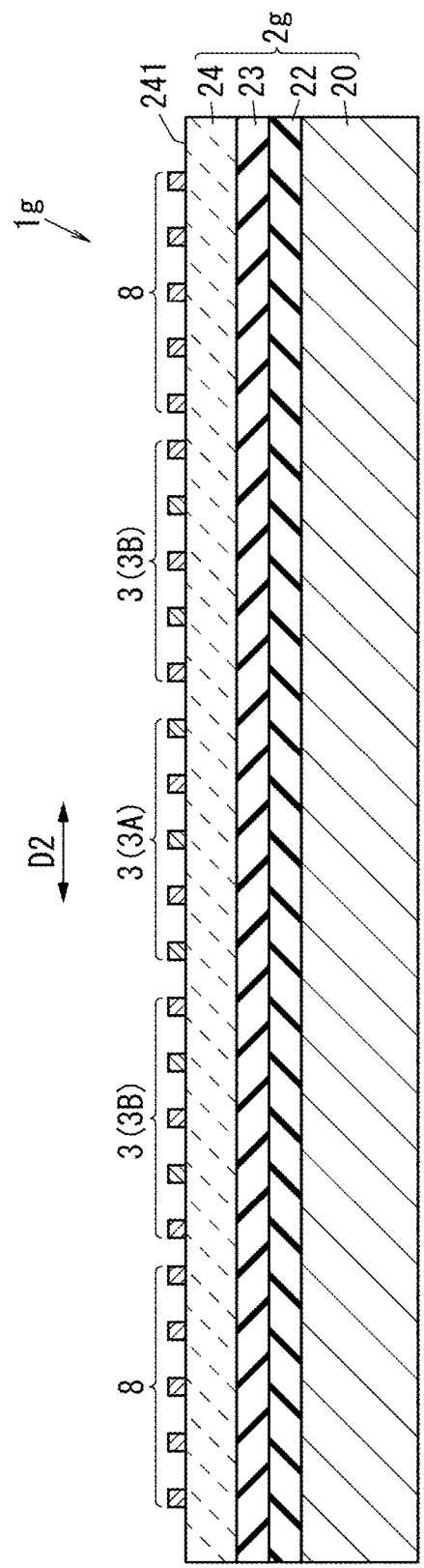
FIG. 15 is a cross-sectional view of an acoustic wave device according to a third modification of the second preferred embodiment of the present invention.

As shown in FIG. 15, in an acoustic wave device 1g according to a third modification of the second preferred embodiment, a multilayer board 2g includes a high acoustic velocity film 22, the low acoustic velocity film 23, and the piezoelectric body portion 24. The high acoustic velocity film 22 is provided on or above the support substrate 20. Here, the state "provided on or above the support substrate 20" includes the case of being directly provided on the support substrate 20 and the case of being indirectly provided on the support substrate 20. In the high acoustic velocity film 22, bulk waves propagate at a higher acoustic velocity than acoustic waves that propagate through the piezoelectric body portion (piezoelectric film) 24. The low acoustic velocity film 23 is provided on or above the high acoustic velocity film 22. Here, the state "provided on or above the high acoustic velocity film 22" includes the case of being directly provided on the high acoustic velocity film 22 and the case of being indirectly provided on the high acoustic velocity film 22. In the low acoustic velocity film 23, bulk waves propagate at a lower acoustic velocity than acoustic waves that propagate through the piezoelectric body portion 24. The piezoelectric body portion 24 is provided on or above the low acoustic velocity film 23.

Here, the state "provided on or above the low acoustic velocity film 23" includes the case of being directly provided on the low acoustic velocity film 23 and the case of being indirectly provided on the low acoustic velocity film 23. As for the acoustic wave device 1g according to the third modification, like reference numerals denote similar components to those of the acoustic wave device 1d (see FIG. 11 and FIG. 12) according to the second preferred embodiment, and the description thereof is omitted.

The support substrate 20 may be made from a piezoelectric body such as, for example, sapphire, lithium tantalate, lithium niobate, and quartz crystal, various ceramics, such as alumina, magnesia, silicon nitride, aluminum nitride, silicon carbide, zirconia, cordierite, mullite, steatite, and forsterite, a dielectric, such as glass, or a semiconductor, such as silicon and gallium nitride, a resin substrate, or the like.

In the acoustic wave device 1g according to the third modification, the high acoustic velocity film 22 functions such that acoustic waves do not leak to the structure below the high acoustic velocity film 22.

In the acoustic wave device 1g according to the third modification, the energy of acoustic waves in a specific mode that is used to obtain the characteristics of a filter or resonator is distributed all over the piezoelectric body portion 24 and the low acoustic velocity film 23, the energy is also distributed to a portion, closer to the low acoustic velocity film 23, of the high acoustic velocity film 22, and the energy is not distributed to the support substrate 20. The mechanism of enclosing acoustic waves by using the high acoustic velocity film 22 is a similar mechanism to the case of surface acoustic waves of a Love wave type that is non-leaking SH (shear horizontal) waves and is, for example, described in Document "Introduction to surface acoustic wave device simulation technology", Kenya HASHIMOTO, published by Realize Inc., p. 26 to p. 28. The above-described mechanism differs from the mechanism of enclosing acoustic waves by using Bragg reflector with an acoustic multilayer film.

The high acoustic velocity film 22 is preferably made of any one of piezoelectric bodies, such as, for example, diamond-like carbon, aluminum nitride, aluminum oxide, silicon carbide, silicon nitride, silicon, sapphire, lithium tantalate, lithium niobate, and quartz crystal, various ceramics, such as alumina, zirconia, cordierite, mullite, steatite, and forsterite, magnesia diamond, a material including any one of the above materials as a main ingredient, and a material including a mixture of some of the above materials as a main ingredient.

For the thickness of the high acoustic velocity film 22, since the high acoustic velocity film 22 encloses acoustic waves in the piezoelectric body portion 24 and the low acoustic velocity film 23, the thickness of the high acoustic velocity film 22 is preferably thicker.

With the acoustic wave device 1g according to the third modification, as well as the acoustic wave device 1d according to the second preferred embodiment, ESD tolerance is improved while interference with a piston mode is reduced or prevented.

(2.6) Fourth Modification of Second Preferred Embodiment

Figure 16:
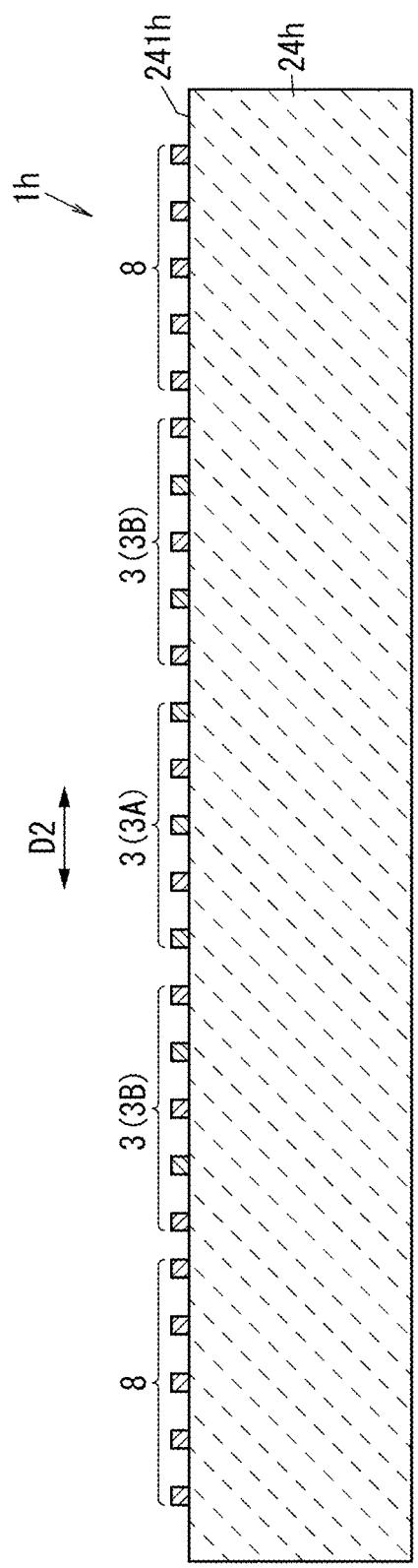
FIG. 16 is a cross-sectional view of an acoustic wave device according to a fourth modification of the second preferred embodiment of the present invention.

As shown in FIG. 16, in an acoustic wave device 1h according to a fourth modification of the second preferred embodiment, a piezoelectric body portion 24h is preferably made from a piezoelectric substrate, and the high acoustic velocity support substrate 21 and the low acoustic velocity film 23 in the acoustic wave device 1d according to the second preferred embodiment are not provided. As for the acoustic wave device 1h according to the fourth modification, like reference numerals denote the same or similar components to those of the acoustic wave device 1d (see FIG. 11 and FIG. 12) according to the second preferred embodiment, and the description thereof is omitted.

In the acoustic wave device 1h, the piezoelectric substrate that defines the piezoelectric body portion 24h is preferably a 128-degree Y-X lithium niobate (LiNbO$_3$) substrate, for example. The piezoelectric substrate is preferably made of, for example, a substrate made of a 50-degree Y-cut X-propagation lithium tantalate (LiTaO$_3$) piezoelectric monocrystal or piezoelectric ceramics (lithium tantalate monocrystal or ceramics cut along a plane having an axis rotated by about 50 degrees from the Y-axis about the X-axis as the direction of the normal, and through which acoustic waves propagate in the X-axis direction). Although not shown in FIG. 16, the acoustic wave device 1h preferably includes a silicon oxide film, for example, that covers the plurality of (three) interdigital transducer electrodes 3, the two reflectors 8, and a region not covered with the plurality of (three) interdigital transducer electrodes 3 and the two reflectors 8 on one main surface 241h of the piezoelectric body portion 24h. In the acoustic wave device 1h, the surface shape of the silicon oxide film includes recesses and protrusions corresponding to the shapes of the three interdigital transducer electrodes 3 and two reflectors 8.

With the acoustic wave device 1h according to the fourth modification, as well as the acoustic wave device 1d according to the second preferred embodiment, ESD tolerance is improved while interference with a piston mode is reduced or prevented.

(2.7) Other Modifications of Second Preferred Embodiment

The number of the plurality of first electrode fingers 6 and the number of the plurality of second electrode fingers 7 in the interdigital transducer electrode 3 of each of the plurality of interdigital transducer electrodes 3 are not limited. Here, in the interdigital transducer electrode 3, the electrode fingers respectively located at two ends in the second direction D2 of the group of electrode fingers are not limited to the first electrode fingers 6. For example, of the group of electrode fingers, the electrode finger located at one end in the second direction D2 may be the first electrode finger 6, and the electrode finger located at the other end may be the second electrode finger 7. Of the group of electrode fingers, the electrode fingers respectively located at one end and another end in the second direction D2 may be the second electrode fingers 7. The group of electrode fingers only needs to have such a configuration that the plurality of first electrode fingers 6 and the plurality of second electrode fingers 7 are spaced apart from each other in the second direction D2 perpendicular or substantially perpendicular to the first direction D1. For example, in an acoustic wave device of one modification, a region in which the first electrode finger 6 and the second electrode finger 7 are arranged one by one so as to be spaced apart from each other and a region in which the two first electrode fingers 6 or the two second electrode fingers 7 are arranged in the second direction D2 may be mixed. In the acoustic wave device of any one of these modifications as well, in at least one interdigital transducer electrode 3 of the adjacent two interdigital transducer electrodes 3 in the second direction D2, the electrode finger closest to the other interdigital transducer electrode 3 in the second direction D2 of a group of electrode fingers does not include the wide portion, and at least one of the electrode fingers other than the electrode finger closest to the other interdigital transducer electrode 3 only needs to include the wide portion. Thus, with the acoustic wave device of any one of these modifications, ESD tolerance is improved while interference with a piston mode is reduced or prevented. At least one first electrode finger 6 of the plurality of first electrode fingers 6 in the interdigital transducer electrode 3 only needs to include the wide portion 62, and at least one second electrode finger 7 of the plurality of second electrode fingers 7 in the interdigital transducer electrode 3 only needs to include the wide portion 72.

The above-described first and second preferred embodiments, and the like, are each only ones of various preferred embodiments of the present invention. The above-described preferred embodiments each may be modified into various configurations according to design, or the like, as long as the object of the present invention is achieved.

For example, in the acoustic wave devices 1, 1a, 1b, 1c, 1d, 1e, 1f, 1g, 1h, the interdigital transducer electrode(s) 3 is/are directly provided on the piezoelectric body portion 24 or piezoelectric body portion 24h. However, the present invention is not limited thereto. The interdigital transducer electrode(s) 3 may be indirectly provided on the piezoelectric body portion 24 or piezoelectric body portion 24h. For example, in the acoustic wave devices 1, 1a, 1b, 1c, 1d, 1e, 1f, 1g, 1h, the interdigital transducer electrode(s) 3 may be provided on the piezoelectric body portion 24 or piezoelectric body portion 24h via a dielectric film.

The acoustic wave devices 1, 1a, 1b, 1c, 1d, 1e, 1f each may include the multilayer board 2g (see FIG. 15) or the piezoelectric body portion 24h (see FIG. 16), instead of the multilayer board 2. In the acoustic wave devices 1, 1a, 1b, 1c, 1d, 1e, 1f, the multilayer board 2 may include a film interposed between the low acoustic velocity film 23 and the high acoustic velocity support substrate 21. In the acoustic wave device 1g, the multilayer board 2g may include at least one of a film interposed between the high acoustic velocity film 22 and the support substrate 20 and a film interposed between the low acoustic velocity film 23 and the piezoelectric body portion 24. In the acoustic wave devices 1, 1a, 1b, 1c, 1d, 1e, 1f, the multilayer board 2 may include an acoustic impedance layer instead of the low acoustic velocity film 23 between the piezoelectric body portion 24 and the high acoustic velocity support substrate 21. The acoustic impedance layer reduces or prevents leakage of acoustic waves excited by the interdigital transducer electrode 3 into the high acoustic velocity support substrate 21. The acoustic impedance layer has a multilayer structure in which at least one high acoustic impedance layer having a relatively high acoustic impedance and at least one low acoustic impedance layer having a relatively low acoustic impedance are laminated in the thickness direction of the high acoustic velocity support substrate 21. In the above-described multilayer structure, a plurality of the high acoustic impedance layers may be provided, and a plurality of the low acoustic impedance layers may be provided. In this case, the above-described multilayer structure is such a structure that the plurality of high acoustic impedance layers and the plurality of low acoustic impedance layers are alternately laminated one by one in the thickness direction of the high acoustic velocity support substrate 21.

The high acoustic impedance layer is preferably made of, for example, platinum, tungsten, aluminum nitride, lithium tantalate, sapphire, lithium niobate, silicon nitride, or zinc oxide.

The low acoustic impedance layer is preferably made of, for example, silicon oxide, aluminum, or titanium.

The number of the interdigital transducer electrodes 3 only needs to be multiple and not limited to three. For example, the number of the interdigital transducer electrodes 3 may be five.

From the above-described preferred embodiments, and the like, the following features are disclosed.

An acoustic wave device (1; 1a; 1b; 1c; 1f; 1g; 1h) according to a preferred embodiment of the present invention includes a first terminal (11), a second terminal (12), a piezoelectric body portion (24; 24h), and a plurality of interdigital transducer electrodes (3). The second terminal (12) has a lower potential than the first terminal (11). The plurality of interdigital transducer electrodes (3) are provided on or above the piezoelectric body portion (24; 24h) and electrically connected to the first terminal (11) and the second terminal (12). Each of the plurality of interdigital transducer electrodes (3) includes a first busbar (4), a second busbar (5), a plurality of first electrode fingers (6), and a plurality of second electrode fingers (7). The second busbar (5) is opposed to the first busbar (4) in the first direction (D1). The plurality of first electrode fingers (6) are connected to the first busbar (4) and extend from the first busbar (4) toward the second busbar (5) in the first direction (D1). The plurality of second electrode fingers (7) are connected to the second busbar (5) and extend from the second busbar (5) toward the first busbar (4) in the first direction (D1). The plurality of first electrode fingers (6) and the plurality of second electrode fingers (7) are spaced apart from each other in a second direction (D2) perpendicular or substantially perpendicular to the first direction (D1). Each of the first busbar (4) and the second busbar (5) includes an opening portion (40, 50), an inner busbar portion (42, 52), an outer busbar portion (41, 51), and a coupling portion (43, 53). The inner busbar portion (42, 52) is located closer to the plurality of first electrode fingers (6) and the plurality of second electrode fingers (7) than the opening portion (40, 50) in the first direction (D1). The outer busbar portion (41, 51) is located across the opening portion (40, 50) from the inner busbar portion (42, 52) in the first direction (D1). The coupling portion (43, 53) couples the inner busbar portion (42, 52) and the outer busbar portion (41, 51) in the first direction (D1). Where, of the plurality of interdigital transducer electrodes (3), one of the adjacent two interdigital transducer electrodes (3) in the second direction (D2) is a first interdigital transducer electrode and another is a second interdigital transducer electrode, one of the electrode finger closest to the second interdigital transducer electrode of the group of electrode fingers of the first interdigital transducer electrode and the electrode finger closest to the first interdigital transducer electrode of the group of electrode fingers of the second interdigital transducer electrode is connected to the first terminal (11), and another is connected to the second terminal (12). In the first interdigital transducer electrode, the electrode finger closest to the second interdigital transducer electrode of the group of electrode fingers of the first interdigital transducer electrode includes a wide portion having greater width in the second direction (D2) than a center portion, in the first direction (D1), of the electrode finger closest to the second interdigital transducer electrode. In the first interdigital transducer electrode, for the electrode finger closest to the second interdigital transducer electrode, a first distance (L1) that is a maximum distance in the second direction (D2) between a center line of the center portion in the first direction (D1) and an outer edge, closer to the second interdigital transducer electrode, of the wide portion is shorter than a second distance (L2) that is a maximum distance in the second direction (D2) between the center line of the center portion and an outer edge, away from the second interdigital transducer electrode, of the wide portion.

With the above-described acoustic wave device (1; 1a; 1b; 1c; 1f; 1g; 1h), ESD tolerance is improved while interference with a piston mode is reduced or prevented.

In an acoustic wave device (1a; 1b; 1c; 1f; 1g; 1h) according to a preferred embodiment of the present invention, in the first interdigital transducer electrode, for the electrode finger closest to the second interdigital transducer electrode, the first distance (L1) is the same or substantially the same as a distance (L01) in the second direction (D2) between the center line of the center portion and the outer edge, closer to the second interdigital transducer electrode, of the center portion.

With the above-described acoustic wave device (1a; 1b; 1c; 1f; 1g; 1h), ESD tolerance is further improved.

An acoustic wave device (1d; 1e; 1f; 1g; 1h) according to a preferred embodiment of the present invention includes a first terminal (11), a second terminal (12), a piezoelectric body portion (24; 24h), and a plurality of interdigital transducer electrodes (3). The second terminal (12) has a lower potential than the first terminal (11). The plurality of interdigital transducer electrodes (3) are provided on or above the piezoelectric body portion (24; 24h) and electrically connected to the first terminal (11) and the second terminal (12). Each of the plurality of interdigital transducer electrodes (3) includes a first busbar (4), a second busbar (5), a plurality of first electrode fingers (6), and a plurality of second electrode fingers (7). The second busbar (5) is opposed to the first busbar (4) in the first direction (D1). The plurality of first electrode fingers (6) are connected to the first busbar (4) and extend from the first busbar (4) toward the second busbar (5) in the first direction (D1). The plurality of second electrode fingers (7) are connected to the second busbar (5) and extend from the second busbar (5) toward the first busbar (4) in the first direction (D1). The plurality of first electrode fingers (6) and the plurality of second electrode fingers (7) are spaced apart from each other in a second direction (D2) perpendicular or substantially perpendicular to the first direction (D1). Each of the first busbar (4) and the second busbar (5) includes an opening portion (40, 50), an inner busbar portion (42, 52), an outer busbar portion (41, 51), and a coupling portion (43, 53). The inner busbar portion (42, 52) is located closer to the plurality of first electrode fingers (6) and the plurality of second electrode fingers (7) than the opening portion (40, 50) in the first direction (D1). The outer busbar portion (41, 51) is located across the opening portion (40, 50) from the inner busbar portion (42, 52) in the first direction (D1). The coupling portion (43, 53) couples the inner busbar portion (42, 52) and the outer busbar portion (41, 51) in the first direction (D1). A distal end portion (61) of at least one of the plurality of first electrode fingers (6) includes a wide portion (62) having a greater width in the second direction (D2) than a center portion (60), in the first direction (D1), of the at least one electrode finger. A distal end portion (71) of at least one of the plurality of second electrode fingers (7) includes a wide portion (72) having a greater width in the second direction (D2) than a center portion (70), in the first direction (D1), of the at least one electrode finger. Where, of the plurality of interdigital transducer electrodes (3), one of the adjacent two interdigital transducer electrodes (3) in the second direction (D2) is a first interdigital transducer electrode and another is a second interdigital transducer electrode, one of the electrode finger closest to the second interdigital transducer electrode of the group of electrode fingers of the first interdigital transducer electrode and the electrode finger closest to the first interdigital transducer electrode of the group of electrode fingers of the second interdigital transducer electrode is connected to the first terminal (11), and another is connected to the second terminal (12). In the first interdigital transducer electrode, the electrode finger closest to the second interdigital transducer electrode does not have the wide portion, and at least one of the electrode fingers other than the electrode finger closest to the second interdigital transducer electrode has the wide portion.

With the above-described acoustic wave device (1d; 1e; 1f; 1g; 1h), ESD tolerance is improved while interference while a piston mode is reduced or prevented.

In an acoustic wave device (1; 1a; 1b; 1c; 1d; 1f; 1e; 1g; 1h) according to a preferred embodiment of the present invention, the plurality of interdigital transducer electrodes (3) are arranged in the second direction (D2), and the acoustic wave device further includes two reflectors (8). The two reflectors (8) each are provided across the interdigital transducer electrode (3) at any one of both sides of the plurality of interdigital transducer electrodes (3) arranged in the second direction (D2) one by one on or above the piezoelectric body portion (24) from the interdigital transducer electrode (3) adjacent to the interdigital transducer electrode (3) at the any one of both sides. The two reflectors (8) reflect acoustic waves excited by the plurality of interdigital transducer electrodes (3).

The above-described acoustic wave device (1; 1a; 1b; 1c; 1d; 1e; 1f; 1g; 1h) is able to define a longitudinally coupled resonator filter.

In an acoustic wave device (1; 1a; 1b; 1c; 1d; 1e; 1f; 1g; 1h) according to a preferred embodiment of the present invention, a distal end portion (61) of at least one of the plurality of first electrode fingers (6) includes a wide portion (62), and a distal end portion (71) of at least one of the plurality of second electrode fingers (7) includes a wide portion (71).

In an acoustic wave device (1; 1a; 1b; 1c; 1d; 1e; 1f; 1g; 1h) according to a preferred embodiment of the present invention, a multilayer body including the piezoelectric body portion (24) and one of the plurality of interdigital transducer electrodes (3) includes a plurality of regions (A1 to A11) different from each other in the first direction (D1) in a plan view taken in a thickness direction of the multilayer body. The plurality of regions (A1 to A11) include a center region (the region A6), two outer busbar regions (the regions A1, A11), two inner busbar regions (the regions A3, A9), two coupling regions (the regions A2, A10), two gap regions (the regions A4, A8), and two wide regions (A7, A5). The center region (the region A6) is located in a center in the first direction (D1) and includes center portions (60) of the plurality of first electrode fingers (6) and center portions (70) of the plurality of second electrode fingers (7). The two outer busbar regions (the regions A1, A11) respectively include the outer busbar portion (41) of the first busbar (4) and the outer busbar portion (51) of the second busbar (5). The two inner busbar regions (the regions A3, A9) respectively include the inner busbar portion (42) of the first busbar (4) and the inner busbar portion (52) of the second busbar (5). The two coupling regions (the regions A2, A10) respectively include the opening portion (40) of the first busbar (4) and the opening portion (50) of the second busbar (5). The two gap regions (the regions A4, A8) respectively include a gap (31) between the plurality of first electrode fingers (6) and the second busbar (5) and a gap (32) between the plurality of second electrode fingers (7) and the first busbar (4). The two wide regions (A7, A5) respectively include the wide portion (62) of at least one electrode finger (the first electrode finger 6) of the plurality of first electrode fingers (6) and the wide portion (72) of at least one electrode finger (the second electrode finger 7) of the plurality of second electrode fingers (7). An acoustic velocity of acoustic waves in the two outer busbar regions (the regions A1, A11) is lower than the acoustic velocity in the center region (the region A6). An acoustic velocity of acoustic waves in the two inner busbar regions (the regions A3, A9) is lower than the acoustic velocity in the center region (the region A6). An acoustic velocity of acoustic waves in the two coupling regions (the regions A2, A10) is higher than the acoustic velocity in the two outer busbar regions (the regions A1, A11) or the acoustic velocity in the center region (the region A6). An acoustic velocity of acoustic waves in the two gap regions (the regions A4, A8) is higher than the acoustic velocity in the two inner busbar regions (the regions A3, A9) or the acoustic velocity in the center region (the region A6). An acoustic velocity of acoustic waves in the two wide regions (A7, A5) is lower than the acoustic velocity in the center region (the region A6).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a first terminal;
   a second terminal having a different potential than the first terminal;
   a piezoelectric body portion; and
   a plurality of interdigital transducer electrodes provided on or above the piezoelectric body portion and electrically connected to the first terminal and the second terminal; wherein
   each of the plurality of interdigital transducer electrodes includes:
      a first busbar;
      a second busbar opposed to the first busbar in a first direction;
      a plurality of first electrode fingers connected to the first busbar and extending from the first busbar toward the second busbar in the first direction; and
      a plurality of second electrode fingers connected to the second busbar and extending from the second busbar toward the first busbar in the first direction;
   the plurality of first electrode fingers and the plurality of second electrode fingers are spaced apart from each other in a second direction perpendicular to the first direction;
   each of the first busbar and the second busbar includes:
      an opening portion;
      an inner busbar portion located closer to a group of electrode fingers including the plurality of first electrode fingers and the plurality of second electrode fingers than the opening portion in the first direction;
      an outer busbar portion located across the opening portion from the inner busbar portion in the first direction; and
      a coupling portion coupling the inner busbar portion and the outer busbar portion in the first direction;
   where, of the plurality of interdigital transducer electrodes, one of two interdigital transducer electrodes adjacent to each other in the second direction is a first interdigital transducer electrode and another one of the two interdigital transducer electrodes adjacent to each other in the second direction is a second interdigital transducer electrode;
   one of the electrode fingers closest to the second interdigital transducer electrode of the group of electrode fingers of the first interdigital transducer electrode and the electrode finger closest to the first interdigital transducer electrode of the group of electrode fingers of the second interdigital transducer electrode is connected to the first terminal, and another one of the electrode fingers closest to the second interdigital transducer electrode of the group of electrode fingers of the first interdigital transducer electrode and the electrode finger closest to the first interdigital transducer electrode of the group of electrode fingers of the second interdigital transducer electrode is connected to the second terminal;
   in the first interdigital transducer electrode, the electrode finger closest to the second interdigital transducer electrode of the group of the electrode fingers of the first interdigital transducer electrode includes a wide portion having a greater width in the second direction than a center portion, in the first direction, of the electrode finger closest to the second interdigital transducer electrode; and
   in the first interdigital transducer electrode, for the electrode finger closest to the second interdigital transducer electrode:
      a first distance that is a maximum distance in the second direction between a center line of the center portion along the first direction and an outer edge, closer to the second interdigital transducer electrode, of the wide portion is shorter than a second distance that is a maximum distance in the second direction between the center line of the center portion and an outer edge, away from the second interdigital transducer electrode, of the wide portion.

2. The acoustic wave device according to claim 1, wherein a multilayer body including the piezoelectric body portion and one of the plurality of interdigital transducer electrodes includes a plurality of regions different from each other in the first direction in a plan view taken in a thickness direction of the multilayer body;
   the plurality of regions includes:
      a center region located in a center in the first direction and including center portions of the plurality of first electrode fingers and center portions of the plurality of second electrode fingers;
      two outer busbar regions respectively including the outer busbar portion of the first busbar and the outer busbar portion of the second busbar;
      two inner busbar regions respectively including the inner busbar portion of the first busbar and the inner busbar portion of the second busbar;
      two coupling regions respectively including the opening portion of the first busbar and the opening portion of the second busbar;
      two gap regions respectively including a gap between the second busbar and the plurality of first electrode fingers and a gap between the first busbar and the plurality of second electrode fingers; and
      two wide regions respectively including the wide portion of at least one of the plurality of first electrode fingers and the wide portion of at least one of the plurality of second electrode fingers;

an acoustic velocity of acoustic waves in the two outer busbar regions is lower than the acoustic velocity in the center region;
an acoustic velocity of acoustic waves in the two inner busbar regions is lower than the acoustic velocity in the center region;
an acoustic velocity of acoustic waves in the two coupling regions is higher than the acoustic velocity in the two outer busbar regions or the acoustic velocity in the center region;
an acoustic velocity of acoustic waves in the two gap regions is higher than the acoustic velocity in the two inner busbar regions or the acoustic velocity in the center region; and
an acoustic velocity of acoustic waves in the two wide regions is lower than the acoustic velocity in the center region.

3. The acoustic wave device according to claim 2, wherein the multilayer body includes a high acoustic velocity support substrate, a low acoustic velocity film, and the piezoelectric body portion.

4. The acoustic wave device according to claim 1, wherein in the first interdigital transducer electrode, for the electrode finger closest to the second interdigital transducer electrode:
the first distance is the same or substantially the same as a distance in the second direction between the center line of the center portion and an outer edge, closer to the second interdigital transducer electrode, of the center portion.

5. The acoustic wave device according to claim 1, wherein the plurality of interdigital transducer electrodes arranged in the second direction; and
the acoustic wave device further includes two reflectors each provided across the interdigital transducer electrode at any one of two sides of the plurality of interdigital transducer electrodes arranged in the second direction one by one on or above the piezoelectric body portion from the interdigital transducer electrode adjacent to the interdigital transducer electrode at the any one of two sides, the two reflectors are configured to reflect acoustic waves excited by the plurality of interdigital transducer electrodes.

6. The acoustic wave device according to claim 1, wherein a distal end portion of at least one of the plurality of first electrode fingers includes the wide portion, and a distal end portion of at least one of the plurality of second electrode fingers includes the wide portion.

7. A longitudinally coupled resonator filter including the acoustic wave device according to claim 1.

8. The acoustic wave device according to claim 1, wherein the first terminal includes two first terminals; and
the second terminal includes two second terminals.

9. The acoustic wave device according to claim 1, wherein the plurality of interdigital transducer electrodes include three interdigital transducer electrodes arranged in the second direction.

10. The acoustic wave device according to claim 1, wherein
each of the plurality of first electrode fingers have a same or substantially a same length; and
each of the plurality of second electrode fingers have a same or substantially a same length.

11. An acoustic wave device comprising:
a first terminal;
a second terminal having a different potential than the first terminal;
a piezoelectric body portion; and
a plurality of interdigital transducer electrodes provided on or above the piezoelectric body portion and electrically connected to the first terminal and the second terminal; wherein
each of the plurality of interdigital transducer electrodes includes:
a first busbar;
a second busbar opposed to the first busbar in a first direction;
a plurality of first electrode fingers connected to the first busbar and extending from the first busbar toward the second busbar in the first direction; and
a plurality of second electrode fingers connected to the second busbar and extending from the second busbar toward the first busbar in the first direction;
the plurality of first electrode fingers and the plurality of second electrode fingers are spaced apart from each other in a second direction perpendicular to the first direction;
each of the first busbar and the second busbar includes:
an opening portion;
an inner busbar portion located closer to a group of electrode fingers including the plurality of first electrode fingers and the plurality of second electrode fingers than the opening portion in the first direction;
an outer busbar portion located across the opening portion from the inner busbar portion in the first direction; and
a coupling portion coupling the inner busbar portion and the outer busbar portion in the first direction;
at least one electrode finger of the plurality of first electrode fingers includes a wide portion having a greater width in the second direction than a center portion, in the first direction, of the at least one electrode finger, and at least one electrode finger of the plurality of second electrode fingers includes a wide portion having a greater width in the second direction than a center portion, in the first direction, of the at least one electrode finger;
where, of the plurality of interdigital transducer electrodes, one of two interdigital transducer electrodes adjacent to each other in the second direction is a first interdigital transducer electrode and another one of the two interdigital transducer electrodes adjacent to each other in the second direction is a second interdigital transducer electrode;
one of the electrode fingers closest to the second interdigital transducer electrode of the group of electrode fingers of the first interdigital transducer electrode and the electrode finger closest to the first interdigital transducer electrode of the group of electrode fingers of the second interdigital transducer electrode is connected to the first terminal, and another one of the electrode fingers closest to the second interdigital transducer electrode of the group of electrode fingers of the first interdigital transducer electrode and the electrode finger closest to the first interdigital transducer electrode of the group of electrode fingers of the second interdigital transducer electrode is connected to the second terminal; and
in the first interdigital transducer electrode, the electrode finger closest to the second interdigital transducer electrode does not include the wide portion, and at least one of the electrode fingers other than the electrode finger closest to the second interdigital transducer electrode includes the wide portion.

12. The acoustic wave device according to claim 11, wherein
the plurality of interdigital transducer electrodes are arranged in the second direction; and
the acoustic wave device further includes two reflectors each provided across the interdigital transducer electrode at any one of two sides of the plurality of interdigital transducer electrodes arranged in the second direction one by one on or above the piezoelectric body portion from the interdigital transducer electrode adjacent to the interdigital transducer electrode at the any one of two sides, the two reflectors are configured to reflect acoustic waves excited by the plurality of interdigital transducer electrodes.

13. The acoustic wave device according to claim 11, wherein
a distal end portion of at least one of the plurality of first electrode fingers includes the wide portion, and a distal end portion of at least one of the plurality of second electrode fingers includes the wide portion.

14. The acoustic wave device according to claim 11, wherein
a multilayer body including the piezoelectric body portion and one of the plurality of interdigital transducer electrodes includes a plurality of regions different from each other in the first direction in a plan view taken in a thickness direction of the multilayer body;
the plurality of regions includes:
a center region located in a center in the first direction and including center portions of the plurality of first electrode fingers and center portions of the plurality of second electrode fingers;
two outer busbar regions respectively including the outer busbar portion of the first busbar and the outer busbar portion of the second busbar;
two inner busbar regions respectively including the inner busbar portion of the first busbar and the inner busbar portion of the second busbar;
two coupling regions respectively including the opening portion of the first busbar and the opening portion of the second busbar;
two gap regions respectively including a gap between the second busbar and the plurality of first electrode fingers and a gap between the first busbar and the plurality of second electrode fingers; and
two wide regions respectively including the wide portion of at least one of the plurality of first electrode fingers and the wide portion of at least one of the plurality of second electrode fingers;
an acoustic velocity of acoustic waves in the two outer busbar regions is lower than the acoustic velocity in the center region;
an acoustic velocity of acoustic waves in the two inner busbar regions is lower than the acoustic velocity in the center region;
an acoustic velocity of acoustic waves in the two coupling regions is higher than the acoustic velocity in the two outer busbar regions or the acoustic velocity in the center region;
an acoustic velocity of acoustic waves in the two gap regions is higher than the acoustic velocity in the two inner busbar regions or the acoustic velocity in the center region; and
an acoustic velocity of acoustic waves in the two wide regions is lower than the acoustic velocity in the center region.

15. A longitudinally coupled resonator filter including the acoustic wave device according to claim 11.

16. The acoustic wave device according to claim 11, wherein the plurality of first electrode fingers each include two of the wide portions.

17. The acoustic wave device according to claim 11, wherein one of the plurality of first electrode fingers includes two of the wide portions and another one of the plurality of first electrode fingers includes only one of the wide portions.

* * * * *